(12) United States Patent
Shrivastava et al.

(10) Patent No.: US 8,536,648 B2
(45) Date of Patent: Sep. 17, 2013

(54) DRAIN EXTENDED FIELD EFFECT TRANSISTORS AND METHODS OF FORMATION THEREOF

(75) Inventors: Mayank Shrivastava, Essex Junction, VT (US); Cornelius Christian Russ, Diedorf (DE); Harald Gossner, Riemerling (DE); Ramgopal Rao, Mumbai (IN)

(73) Assignees: Infineon Technologies AG, Neubiberg (DE); Indian Institute of Technology Bombay, Mumbai (IN)

( * ) Notice: Subject to any disclaimer, the term of this patent is extended or adjusted under 35 U.S.C. 154(b) by 183 days.

(21) Appl. No.: 13/020,368

(22) Filed: Feb. 3, 2011

(65) Prior Publication Data

US 2012/0199878 A1  Aug. 9, 2012

(51) Int. Cl.
  *H01L 29/76*  (2006.01)
(52) U.S. Cl.
  USPC .................................. 257/335; 257/E29.242
(58) Field of Classification Search
  USPC ............................. 257/192, 335, 337, E29.242
  See application file for complete search history.

(56) References Cited

U.S. PATENT DOCUMENTS

| | | | |
|---|---|---|---|
| 5,493,142 A | 2/1996 | Randazzo et al. | |
| 5,903,032 A | 5/1999 | Duvvury | |
| 5,982,600 A | 11/1999 | Cheng | |
| 6,071,768 A | 6/2000 | Duvvury et al. | |
| 6,100,125 A | 8/2000 | Hulfachor et al. | |
| 6,310,380 B1 * | 10/2001 | Cai et al. | 257/355 |
| 6,521,946 B2 | 2/2003 | Mosher | |
| 6,876,035 B2 * | 4/2005 | Abadeer et al. | 257/343 |
| 2005/0067653 A1 * | 3/2005 | Litwin et al. | 257/335 |
| 2006/0125023 A1 * | 6/2006 | Shigyo et al. | 257/384 |
| 2006/0278924 A1 * | 12/2006 | Kao | 257/339 |
| 2007/0278568 A1 * | 12/2007 | Williams et al. | 257/335 |
| 2008/0073745 A1 * | 3/2008 | Tang et al. | 257/500 |
| 2009/0008710 A1 | 1/2009 | Wei et al. | |
| 2009/0140372 A1 | 6/2009 | Hodel et al. | |
| 2009/0283825 A1 * | 11/2009 | Wang et al. | 257/335 |
| 2010/0019318 A1 | 1/2010 | Chao et al. | |
| 2010/0032758 A1 | 2/2010 | Wang et al. | |
| 2010/0062573 A1 | 3/2010 | Gossner et al. | |
| 2010/0155895 A1 * | 6/2010 | Tsai | 257/578 |
| 2010/0237412 A1 | 9/2010 | Shrivastava et al. | |

OTHER PUBLICATIONS

Shrivastava, M., et al., "Part I: On the Behavior of STI-Type DeNMOS Device Under ESD Conditions," IEEE Transactions on Electron Devices, 2010, pp. 1-8.
Shrivastava, M., et al., "Part II: On the Three-Dimensional Filamentation and Failure Modeling of STI Type DeNMOS Device Under Various ESD Conditions," IEEE Transactions on Electron Devices, vol. 57, No. 9, Sep. 2010, pp. 2243-2250.

* cited by examiner

*Primary Examiner* — Julio J Maldonado
*Assistant Examiner* — Sarah Salerno
(74) *Attorney, Agent, or Firm* — Slater & Matsil, L.L.P.

(57) ABSTRACT

In an embodiment of the invention, a semiconductor device includes a first region having a first doping type, a channel region having the first doping type disposed in the first region, and a retrograde well having a second doping type. The second doping type is opposite to the first doping type. The retrograde well has a shallower layer with a first peak doping and a deeper layer with a second peak doping higher than the first peak doping. The device further includes a drain region having the second doping type over the retrograde well. An extended drain region is disposed in the retrograde well, and couples the channel region with the drain region. An isolation region is disposed between a gate overlap region of the extended drain region and the drain region. A length of the drain region is greater than a depth of the isolation region.

33 Claims, 18 Drawing Sheets

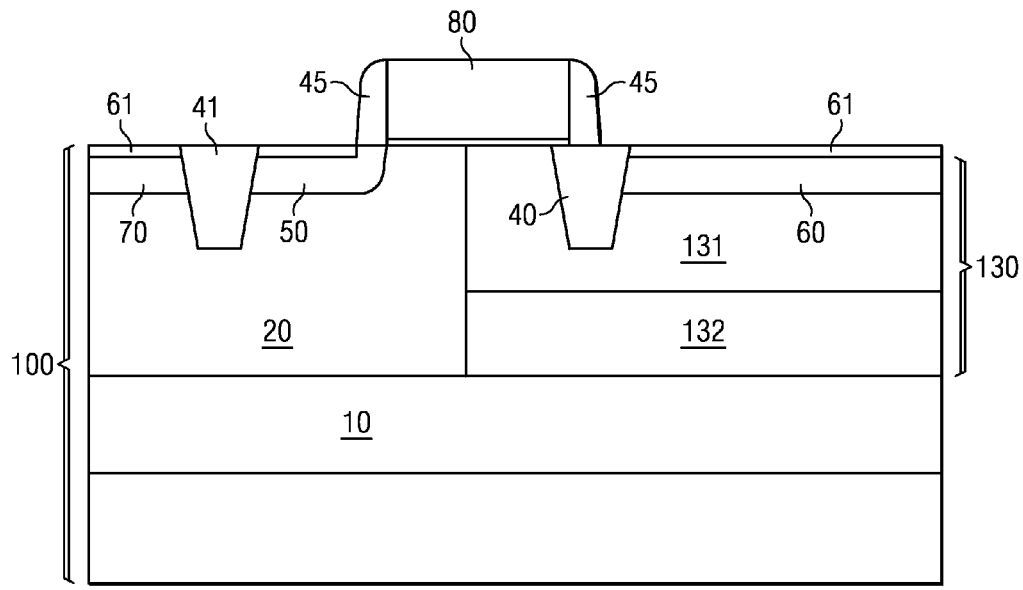

FIG. 12g

| TECHNOLOGY NODE | XJ (nm) | $D_{ST}$ (nm) | $D_B$ (nm) | DL (nm) | $N_{INT}$ (cm$^{-3}$) | $N_B$ (cm$^{-3}$) |
|---|---|---|---|---|---|---|
| 65nm | 90-100 | 330-370 | 350-400 | >700 | $2\times10^{17}$-$4\times10^{17}$ | $1\times10^{18}$-$2\times10^{18}$ |
| 45nm | 80-90 | 310-350 | 330-380 | >650 | $2\times10^{17}$-$4\times10^{17}$ | $1\times10^{18}$-$2\times10^{18}$ |
| 32nm | 70-80 | 270-310 | 290-330 | >600 | $3\times10^{17}$-$5\times10^{17}$ | $1\times10^{18}$-$2\times10^{18}$ |
| 28nm | 60-70 | 230-270 | 250-290 | >550 | $3\times10^{17}$-$5\times10^{17}$ | $2\times10^{18}$-$3\times10^{18}$ |
| 20nm | 50-60 | 200-240 | 220-260 | >500 | $4\times10^{17}$-$6\times10^{17}$ | $2\times10^{18}$-$3\times10^{18}$ |
| 16nm | 40-50 | 180-220 | 200-240 | >450 | $4\times10^{17}$-$6\times10^{17}$ | $2\times10^{18}$-$3\times10^{18}$ |
| 10nm | 30-40 | 170-210 | 190-230 | >400 | $5\times10^{17}$-$7\times10^{17}$ | $3\times10^{18}$-$4\times10^{18}$ |

DRAIN EXTENDED FIELD EFFECT TRANSISTORS AND METHODS OF FORMATION THEREOF

TECHNICAL FIELD

This invention relates generally to semiconductor devices and methods, and more particularly to drain extended field effect transistors and methods of forming thereof.

BACKGROUND

As electronic components are becoming smaller and smaller along with the internal structures in integrated circuits, it is becoming easier to either completely destroy or otherwise impair electronic components. In particular, many integrated circuits are highly susceptible to damage from the discharge of static electricity. Generally, electrostatic discharge (ESD) is the transfer of an electrostatic charge between bodies at different electrostatic potentials or voltages, caused by direct contact or induced by an electrostatic field. The discharge of static electricity, or ESD, has become a critical problem for the electronics industry.

Device failures resulting from ESD events are not always immediately catastrophic or apparent. Often, the device is only slightly weakened but is less able to withstand normal operating stresses. Such a weakened device may result in reliability problems such as increased leakage currents resulting in degraded performance of the device.

System-on-Chip (SoC) ICs are produced in advanced CMOS technologies where no gate oxides of appropriate thickness are available for cost reasons. In such applications, one challenge is to provide an ESD robust high voltage (HV) transistor element which has excellent mixed signal performance and gate oxide reliability.

Such HV devices should operate over a wide range of interface voltage, e.g., 5V to 12 V. Such wide interoperability allows them to used for applications such as for an input/output (IO) circuit implemented in a SoC.

One option is to use drain extended field effect transistors also referred as drain extended MOS devices (DeMOS) for IO drivers in SoC ICs. DeMOS transistors are asymmetric in the drain and source construction allowing large voltages to be directly applied to the transistor pads.

However, DeMOS transistors are ESD-weak and require additional protective circuitry to prevent damage from ESD. Additional ESD circuitry, however, increases the cost of the chip.

Therefore, to improve efficiency of silicon real estate and reduce the chip cost, DeMOS transistors with good ESD immunity are required.

FIG. 1 illustrates a conventional drain extended metal oxide semiconductor (DeMOS) (n-channel) transistor.

Referring to FIG. 1, a substrate 100 comprises a p-body region 10. A p-well region 20 and an n-well region 30 are disposed adjacent and have a common p-n junction as illustrated. Isolation regions comprising a drain sided isolation region 40 and other isolation regions 41 (e.g., STI—Shallow Trench Isolation) are formed within the substrate 100. The channel region 35 of the DeMOS transistor 1 is formed within the p-well region 20. A source region 50 having a n$^+$ doping is disposed within the p-well region 20 of the substrate 100. A drain region 60 having a n$^+$ doping is disposed within the n-well region 30 of the substrate 100. A substrate contact region 70 having a p$^+$ doping is disposed within the p-well region 20 to contact the p-well region 20. A gate 80 is disposed between the source region 50 and the drain region 60. Spacers 45 are disposed on the sidewalls of the gate 80. Under normal operation as a field effect transistor (FET), e.g., when an inversion layer is formed within the channel region 35, the charge carriers from the source region 50 move across the channel region 35 and flow through an extended drain region 51 (shown by the arrow) around the STI corners before reaching the drain region 60. Thus portions of the n-well region 30 under the drain-sided isolation region 40 and the gate 80 form part of the drain of the DeMOS transistor 1.

As a consequence, the potential from the drain contact of the drain region 60 is dropped due to the increased resistance of the lower doped n-well region 30 that forms the extended drain region 51. The drain-sided isolation region 40 underneath gate-to-drain overlap is used to protect device from any gate oxide failure while applying high bias at the drain region 51. However, such a device configuration results into space charge modulation due to localized current distribution and cause a very early thermal failure of the device, which is attributed to filament formation. As will be described in detail below, this construction results in poor ESD performance requiring additional circuitry to protect the device against ESD damage.

Hence what are needed are devices that are robust against ESD stress.

SUMMARY OF THE INVENTION

These and other problems are generally solved or circumvented, and technical advantages are generally achieved, by illustrative embodiments of the present invention.

In accordance with an embodiment of the present invention, a semiconductor device comprises a first region having a first doping type disposed in a substrate, a channel region having the first doping type disposed in the first region, and a retrograde well having a second doping type disposed in the substrate. The second doping type is opposite to the first doping type. The retrograde well has a shallower layer with a first peak doping and a deeper layer with a second peak doping, which is higher than the first peak doping. The semiconductor device further comprises a drain region having the second doping type disposed in the substrate over the retrograde well. An extended drain region is disposed in the retrograde well and comprises a gate overlap region. The extended drain region couples the channel region with the drain region. An isolation region is disposed between the gate overlap region of the extended drain region and the drain region. A length of the drain region is greater than a depth of the isolation region.

In accordance with another embodiment of the present invention, a drain extended field effect transistor comprises a first region having a first doping type disposed in a substrate, a source region disposed in or above the first region, and a retrograde well having a second doping type disposed in the substrate. The second doping type is opposite to the first doping type. The first region and the retrograde well have a common junction. The retrograde well has a first layer having a lower peak doping than a deeper second layer. The drain extended field effect transistor further comprises a drain region disposed in or above the retrograde well. A channel region is disposed between the source region and the drain region in the first region. A gate is disposed above the substrate between the source region and the drain region. An extended drain region is disposed in the retrograde well and comprises a gate overlap region. The extended drain region couples the channel region with the drain region. An isolation region is disposed between the gate overlap region and the drain region. A depth of the first layer is greater than a depth of the isolation region.

In accordance with another embodiment of the present invention, a method of forming a semiconductor device comprises forming a first region having a first doping type in a substrate, forming a first well by implanting dopants of a second doping type into the substrate at a first implant condition, and forming a second well by implanting dopants of the second doping type into the substrate at a second implant condition. The second doping type is opposite to the first doping type. The second well is disposed within the first well. The second implant condition has an implant dose smaller than an implant dose of the first implant condition. The second implant condition has an implant energy lower than an implant energy of the first implant condition. The method further comprises forming an isolation region in the second well, forming a source region in or above the first region, and forming a drain region in or above the second well. A length of the drain region is greater than a depth of the isolation region. A channel region is formed between the source region and the drain region in the first region. An extended drain region is formed in the first and the second wells. The extended drain region couples the channel region with the drain region. The extended drain region comprises a gate overlap region. The isolation region is disposed between the gate overlap region and the drain region.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes FIGS. 2a-2c, illustrates the ESD performance of the conventional device illustrated in FIG. 1, wherein FIG. 2a illustrates experimental performance, and wherein FIGS. 2b-2c illustrates the failure mechanism using device simulation;

FIG. 4, which includes FIGS. 4a-4e, illustrates an alternative embodiment of the invention, wherein FIG. 4a illustrates a schematic cross sectional view, FIG. 4b illustrates experimental ESD and MOS operational data, FIG. 4c shows the Id-Vd curves under normal MOS operation, FIG. 4d illustrates a simulated charge density profiles using a device simulator, and FIG. 4e illustrates the corresponding simulated electric field;

FIG. 10, which includes

FIG. 12, which includes FIGS. 12a-12g, illustrates a method of manufacturing the DeMOS transistor in accordance with embodiments of the invention; and FIG. 13 illustrates possible ranges for parameters described in various embodiments of the invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
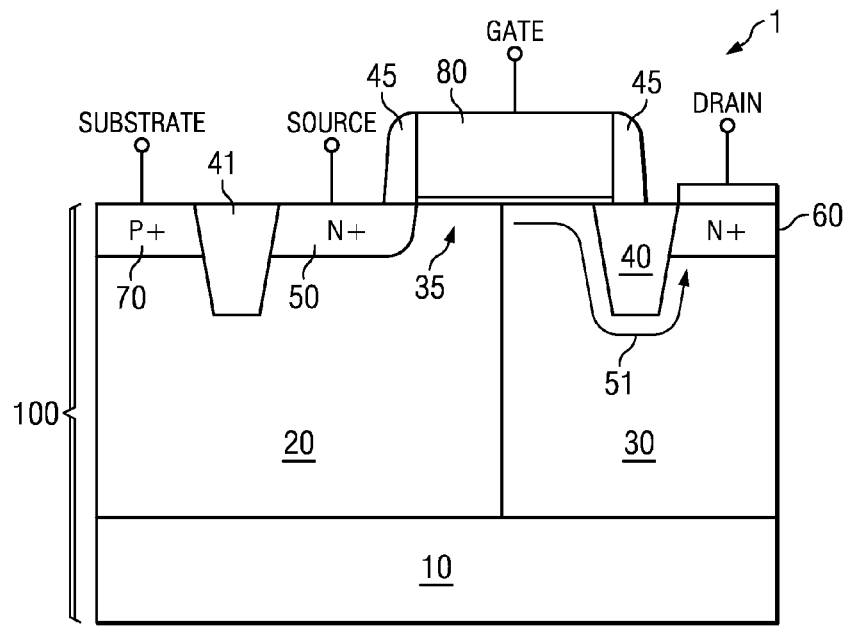
FIG. 1 illustrates a conventional drain extended metal oxide semiconductor (DeMOS) (n-channel) transistor.
Figure 2A:
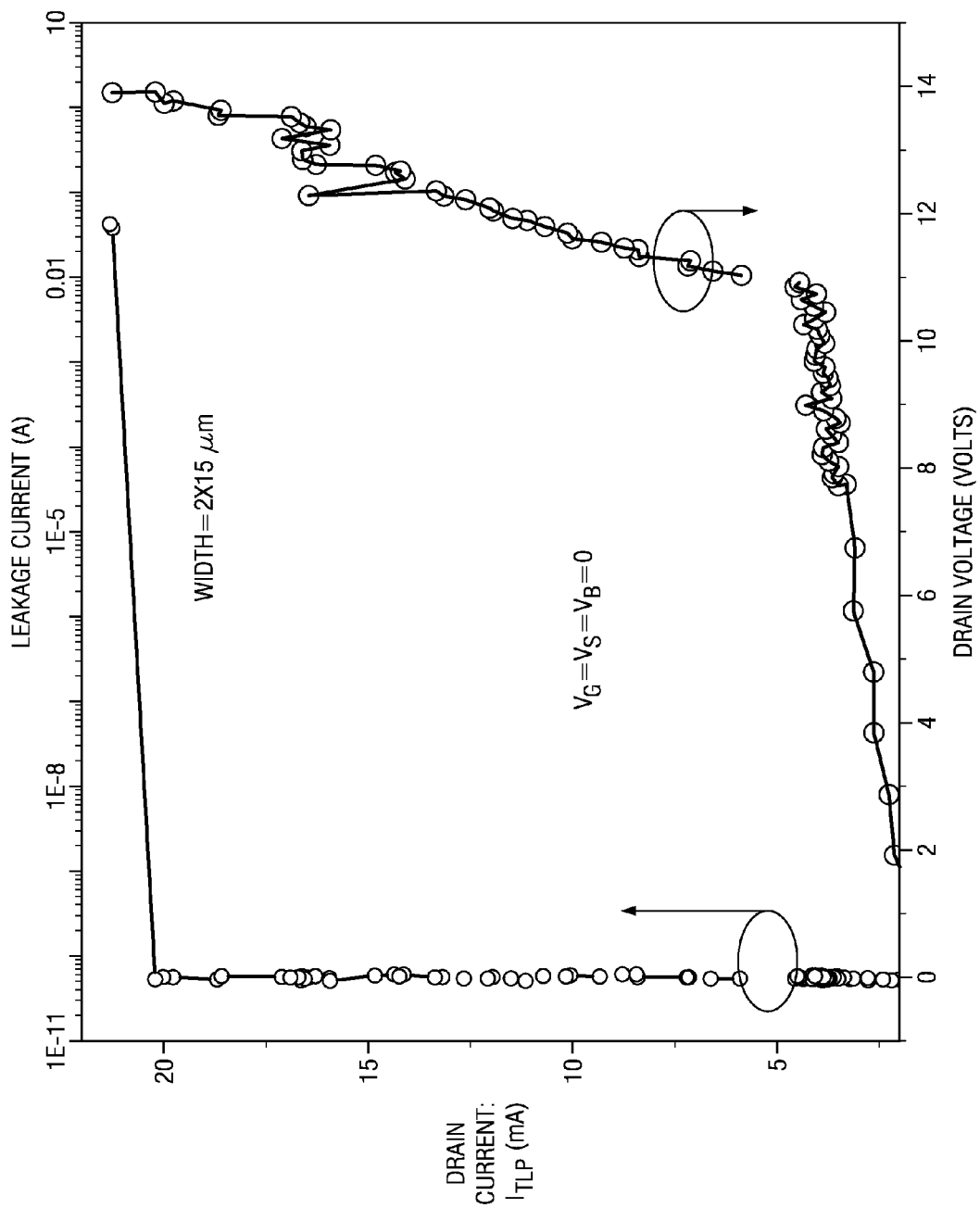
Figure 2B:
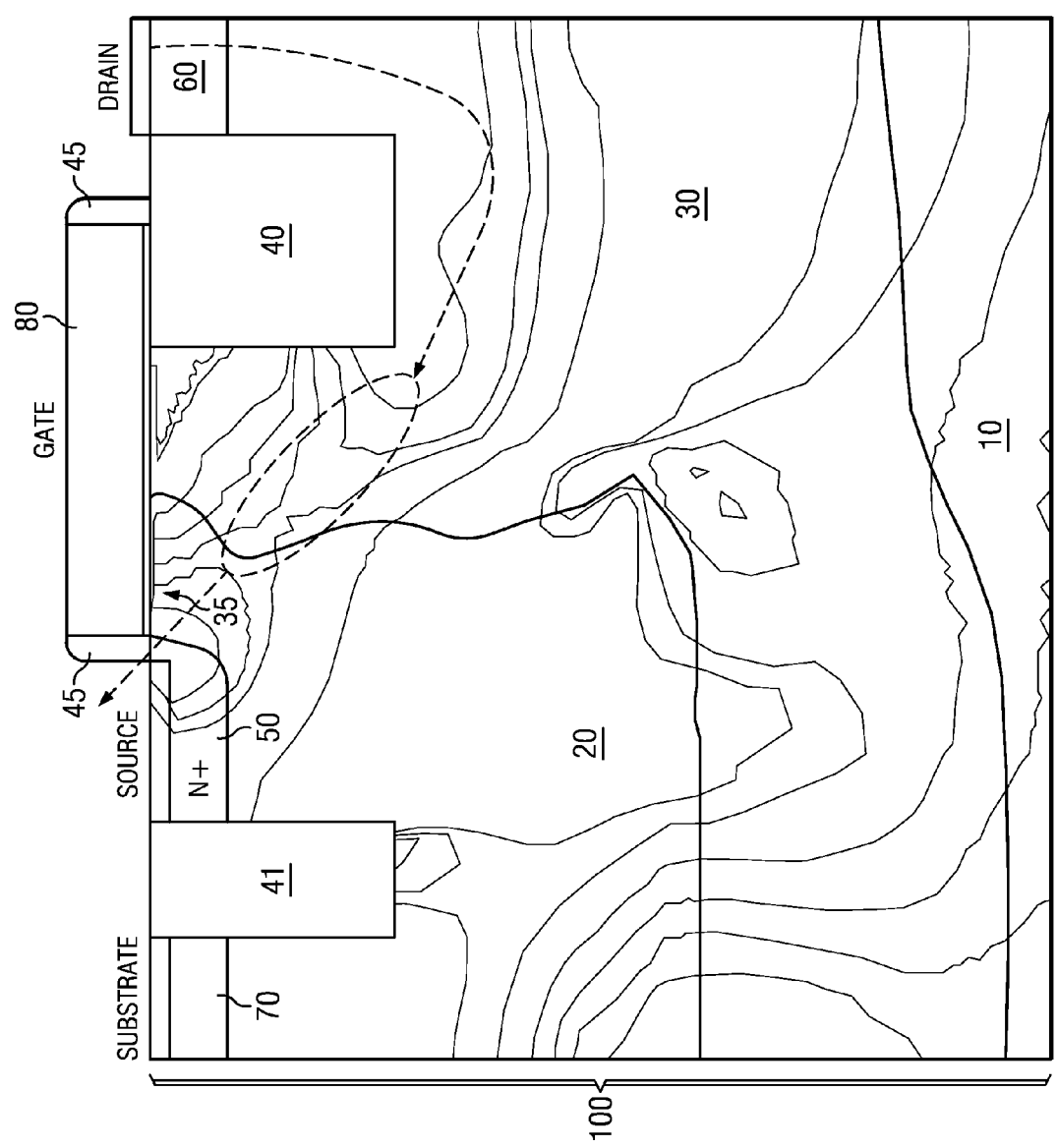
Figure 2C:
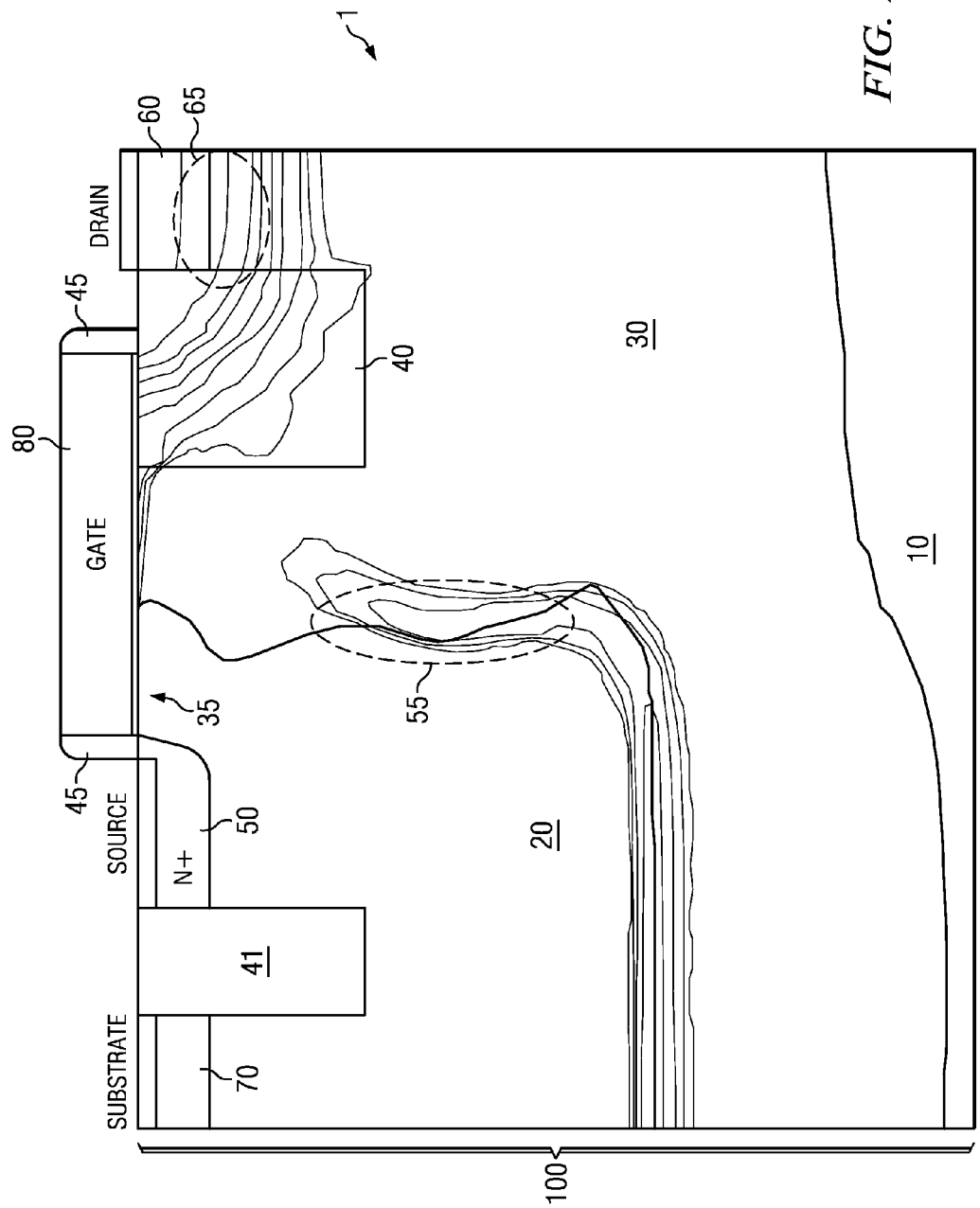

FIG. 2, which includes FIGS. 2a-2c, illustrates the ESD performance of the device illustrated in FIG. 1, wherein FIG. 2a illustrates experimental performance, and wherein FIGS. 2b-2c illustrates the failure mechanism using device simulation.

Referring to FIG. 2a, the lower x-axis represents the drain voltage (e.g., voltage in drain region 60 in FIG. 1). The upper x-axis represents the leakage current (sub-threshold leakage and gate leakage) during normal operation of the device after ESD stress. The y-axis represents the drain current $I_{TLP}$ (ESD pulse) used to stress the device. Note that drain current $I_{TLP}$ is absolute current and not current per unit width as conventionally used.

The plot of $I_{TLP}$ v. drain voltage represents the behaviour of the device during ESD stress. An ESD pulse is applied for 100 ns on the drain terminal of the DeMOS transistor 1 while grounding the other terminals of the DeMOS transistor. The $I_{TLP}$ v. drain voltage shows the increase in drain voltage as the magnitude of the current pulse is increased.

The plot of $I_{TLP}$ v. leakage current represents the normal operational leakage current (OFF current) after the ESD stress. As illustrated after a critical drain current $I_{TLP}$ the leakage current increases exponentially. This critical drain current ($I_{t2}$) is the maximum ESD stress that the device can take before the device is permanently damaged. Therefore, the critical drain current ($I_{t2}$) is a measure of the ESD immunity of the DeMOS transistor.

As illustrated in FIG. 2a, the conventional DeMOS device fails after stressing with a drain current $I_{TLP}$ of about 20 mA, which is 0.75 mA/μm—a very low value. I/O devices should be immune to as much as possible ESD stress current (4-5 mA/μm is considered as an acceptable range). Otherwise additional ESD protection circuitry should be introduced to protect the I/O devices increasing the cost of the chip. Embodiments of the invention overcome these and other limitations of conventional DeMOS devices.

FIGS. 2b-2c illustrates the failure mechanism of the conventional device illustrated in FIG. 1.

As described herein, using technology computer aided design (TCAD) models, the inventors have identified the reasons for the failure of the conventional DeMOS transistors.

FIGS. 2b and 2c illustrate simulation results of a DeMOS transistor after being subjected to the ESD stress. FIG. 2b shows the current density (A/cm2) within the DeMOS transistor at the end of the ESD pulse of $I_{TLP}$ of 1.2 mA/μm. The corresponding electric field profile within the transistor is shown in FIG. 2c.

Under ESD stress, the transistor behaves like an npn bipolar transistor. The source region 50 forms the emitter, the p-well region 20 forms the base and the n-well region 30 (extended drain) form the collector, and the drain region 60 form the sub-collector.

Referring first to FIG. 2b, the diode between the source region 50 and the p-well region 20 is triggered. However, there is no damage to the device at this stage. As illustrated by the current density profiles, the peak current density flows around the drain-sided isolation region 40. However, the current flow is localized under the drain-sided isolation region 40 and into the drain region 60. Importantly, the maximum current density increases from the p-well region 20/n-well region 30 junction towards the drain region 60, where it is highly localized.

This also impacts the electric field within the device. In other words, under low drain voltages, the transistor has a well defined junction boundary between the p-well region 20 (p type base) and the n-well region 30. However, as ESD stress voltage is increased (which increases the current density), the excess charge in the n-well region 30 (extended drain) becomes comparable or greater than the fixed ionized impurity concentration of the n-well region 30. The excess electrons may induce excess holes to maintain quasi-neutrality and thereby extend the p-type base from the p-well region 20/n-well region 30 junction to the higher doped drain region 60. In other words, the p-type base region extends until it reaches the higher doped drain region 60 where the excess electron concentration becomes comparable or less than the fixed ionized impurity concentration.

As a direct consequence, the high electric field region is pushed from the p-well region 20/n-well region 30 junction to a smaller area under the drain region 60.

This is clearly illustrated in FIG. 2c showing high electric fields in a first region 65 under the drain region 60. In contrast, in a second region 55 adjacent the junction between the p-well region 20 and the n-well region 30, there is minimal space charge resulting in low electric fields. This phenomenon— also called "base push out" or "base widening"—results in high electric fields in the first region 65.

The high electric field and/or high current densities locally breaks down the silicon lattice. For example, portions of the silicon may break down, e.g., locally melt down, forming silicon filaments.

Embodiments of the invention overcome these problems by minimizing the base push out phenomenon without introducing higher ON resistance paths that may degrade performance of the DeMOS transistor under normal FET operation. This is achieved by creating a doping structure that reduces the base widening mechanism, which is achieved by placing higher doped regions in the current path and avoiding concentration of current density in a localized region.

Structural embodiments of DeMOS transistors having improved ESD immunity without compromising performance will be described with respect to FIGS. 3-11. Methods of forming DeMOS transistors in accordance with embodiments of the invention will be described using FIG. 12.

Figure 3:
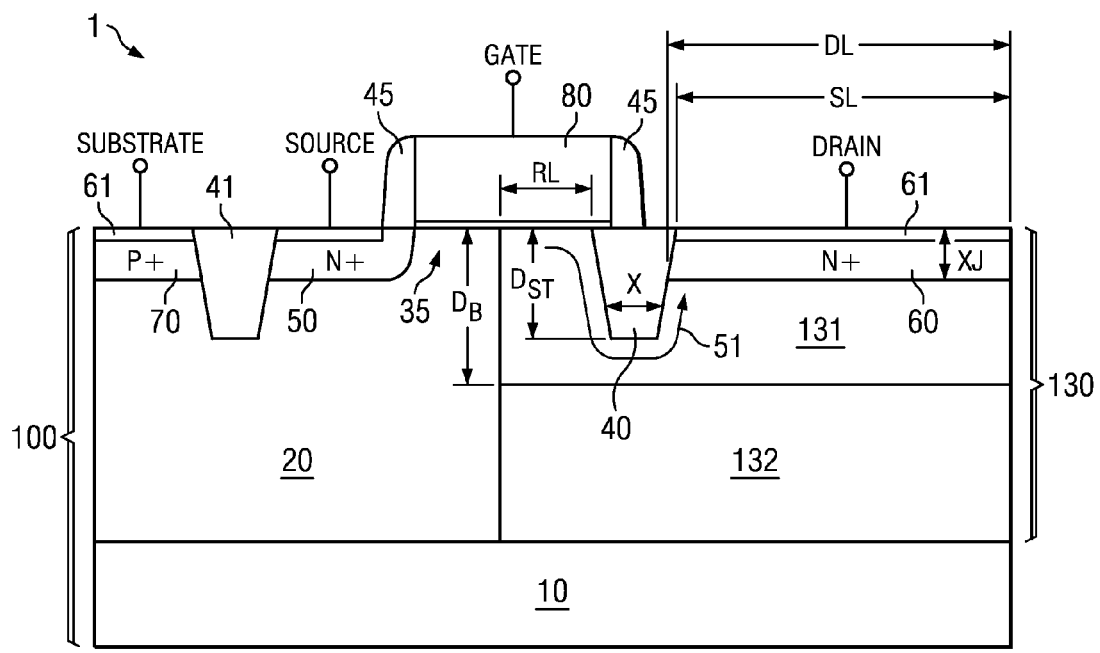
FIG. 3 illustrates a DeMOS transistor in accordance with an embodiment of the invention.

FIG. 3 illustrates a DeMOS transistor in accordance with an embodiment of the invention.

The DeMOS transistor 1 includes a substrate 100 with a p-body region 10. A p-well region 20 is disposed within the substrate 100. Isolation regions comprising the drain-sided isolation region 40 and other isolation regions 41 are formed within the substrate 100. The channel region 35 of the DeMOS transistor 1 is formed within the p-well region 20. A source region 50 is disposed within the p-well region 20 of the substrate 100. A drain region 60 is disposed within the n-well region 30 of the substrate 100. A substrate contact region 70 is disposed within the p-well region 20 to contact the p-well region 20. A gate 80 is disposed between the source region 50 and the drain region 60. A silicide region 61 is disposed on the drain region 60. Spacers 45 are disposed on the sidewalls of the gate 80.

However, in this embodiment, a retrograde n-well 130 is formed within the substrate 100 adjacent the p-well region 20. The retrograde n-well 130 forms a p-n junction with the p-well region 20. The retrograde n-well 130 comprises a first n-well region 131 having a doping $N_{INT}$ and a second n-well region 132 having a doping $N_B$. The doping $N_{INT}$ of the first n-well region 131 is lower than the doping $N_B$ of the second n-well region 132 thereby forming the retrograde n-well 130. The higher doping of the second n-well region 132 distributes more of the charge carriers into the second n-well region 132. Because the second n-well region 132 is designed to be deeper and away from the drain region 60, the electric field peak region is also shifted back adjacent the p-well region 20/second n-well region 132.

In various embodiments, the ratio of the doping $N_B$ of the second n-well region 132 to the doping $N_{INT}$ of the first n-well region 131 is at least 3:1, and about 10:1 in one embodiment. In various embodiments, the doping of the p-well region 20 is about $5 \times 10^{16}$ cm$^{-3}$ to about $10^{18}$ cm$^{-3}$, the doping $N_{INT}$ of the first n-well region 131 is about $1 \times 10^{17}$ cm$^{-3}$ to about $5 \times 10^{18}$ cm$^{-3}$, the doping $N_B$ of the second n-well region 132 is about $10^{18}$ cm$^{-3}$ to about $5 \times 10^{19}$ cm$^{-3}$.

Because of the existence of the drain-sided isolation region 40 further precautions should be taken to realize the reversal of base push out.

The length RL of the gate overlap over the extended drain region 51 is typically pre-determined in achieving the transistor operating performance. In various embodiments, very small values of the length RL of the gate overlap should be avoided to avoid increase in charge density concentration around and under the left edge of the drain-sided isolation region 40. In one embodiment, the value of RL may be at least 150 nm to obtain a specified level of On current.

The depth $D_{ST}$ of the drain-sided isolation region 40 should be greater than the depth XJ of the drain region 60. If the depth XJ of the drain region 60 approaches the depth $D_{ST}$ of the drain-sided isolation region 40, significant portion of the charge carriers are distributed in a small region under the drain-sided isolation region 40 and around the right corner of the drain-sided isolation region 40. Again this can be avoided by reducing the depth XJ of the drain region 60 relative to the depth $D_{ST}$ of the drain-sided isolation region 40. In various embodiments, the depth $D_{ST}$ of the drain-sided isolation region 40 should be at least twice the depth XJ of the drain region 60.

In various embodiments, the length DL of the drain region 60 should be greater than the depth $D_{ST}$ of the drain-sided isolation region 40. In one embodiment, the length DL of the drain region 60 should be about twice or at least twice of the depth $D_{ST}$ of the drain-sided isolation region 40. The larger area of the drain region 60 relative to the isolation depth helps to ensure that the charge carriers are distributed across the well region. For example, if the area of the drain region 60 is much smaller than the isolation depth, the charge carriers are concentrated along the right sidewall of the drain-sided isolation region 40. This would result in break down of the silicon along the isolation sidewalls. In contrast, if the area of the drain region 60 is much larger than the isolation depth, the charge carriers will be spaced out along the right sidewall of the drain-sided isolation region 40 thereby avoiding any break down in that region.

In various embodiments, a depth $D_B$ of the first n-well region 131 should be greater than the depth $D_{ST}$ of the drain-sided isolation region 40. In various embodiments, a depth $D_B$ of the first n-well region 131 is at least 1.3× the depth $D_{ST}$ of the drain-sided isolation region 40. If the depth $D_B$ of the first n-well region 131 approaches or is less than the depth $D_{ST}$ of the drain-sided isolation region 40, the second n-well region 132 is disposed under the drain-sided isolation region 40. As a consequence, all the charge carriers are distributed in a thin zone immediately under the drain-sided isolation region 40, which increases the susceptibility of this region under the drain-sided isolation region 40 to break down. By moving the second n-well region 132 away from the drain-sided isolation region 40, this charge localization can be prevented avoiding breakdown in a region under the drain-sided isolation region 40.

Embodiments of the invention also may require that the depth $D_{ST}$ of the drain-sided isolation region 40 is greater than the width X of the drain-sided isolation region 40.

In various embodiments, the length SL of the silicide region 61 should be about the same as the length DL of the drain region 60. In various embodiments, the width of the silicide region 61 is also about the same as the width of the drain region 60, which is about the same as the width of the DeMOS transistor, the width of the silicide region 61, width of the drain region 60, and the width of the DeMOS transistor being measured perpendicular to the current flow direction. A small silicide region 61 can result in high current density through a small region within the silicide region 61 and/or around the silicide region 61 in the drain region 60 resulting in break down of the silicide region 61 and/or the drain region 60.

Advantageously, the embodiments of the invention do not impact the ON current of the transistor because the spaced out carrier distribution helps to improve the sheet resistance of the extended drain region 51 due to reduced scattering between carriers at lower current densities. Further, the higher doped regions if in the path of the current flow will further decrease the drain resistance.

Figure 4A:
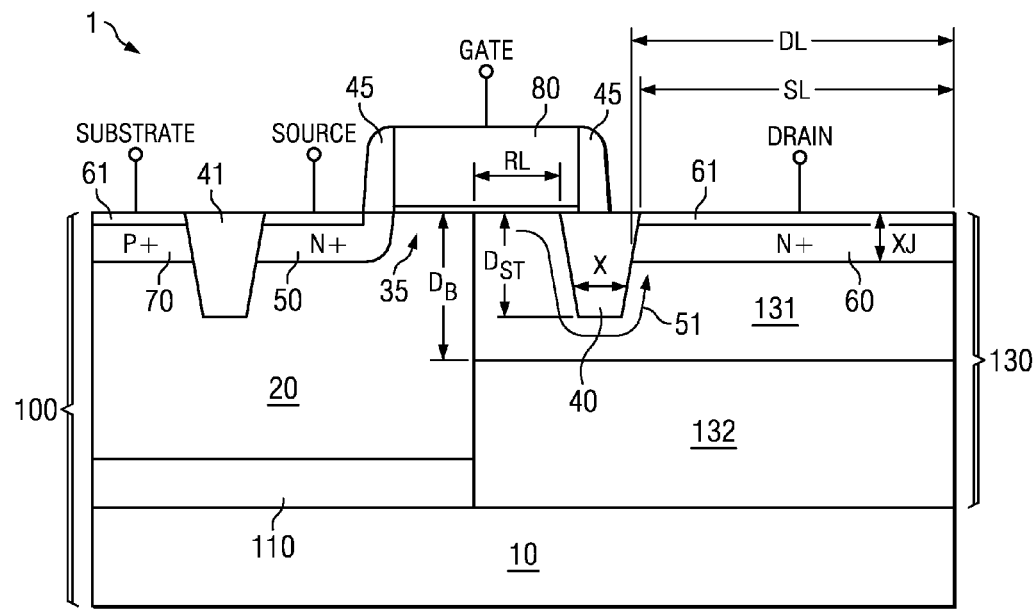
Figure 4B:
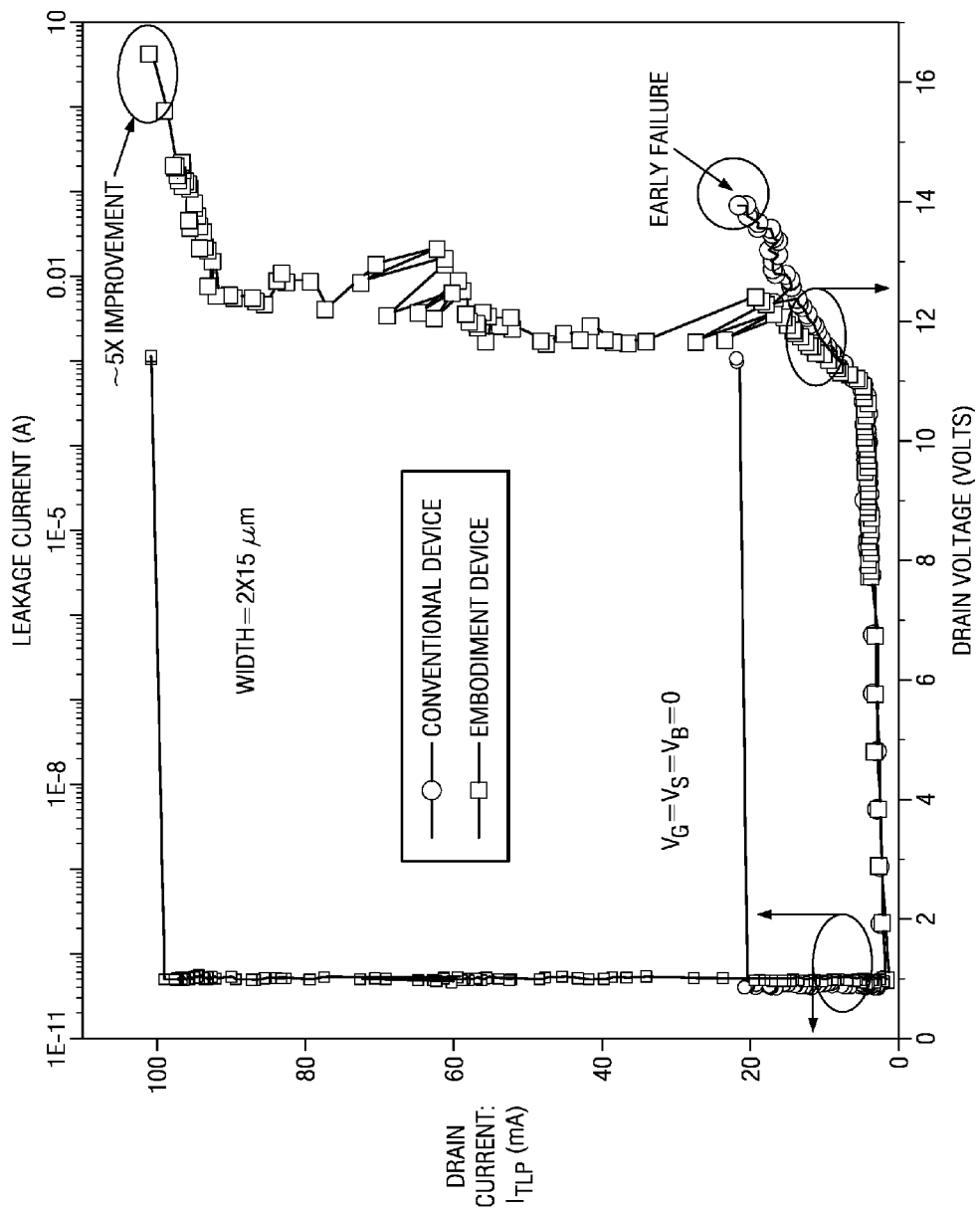
Figure 4C:
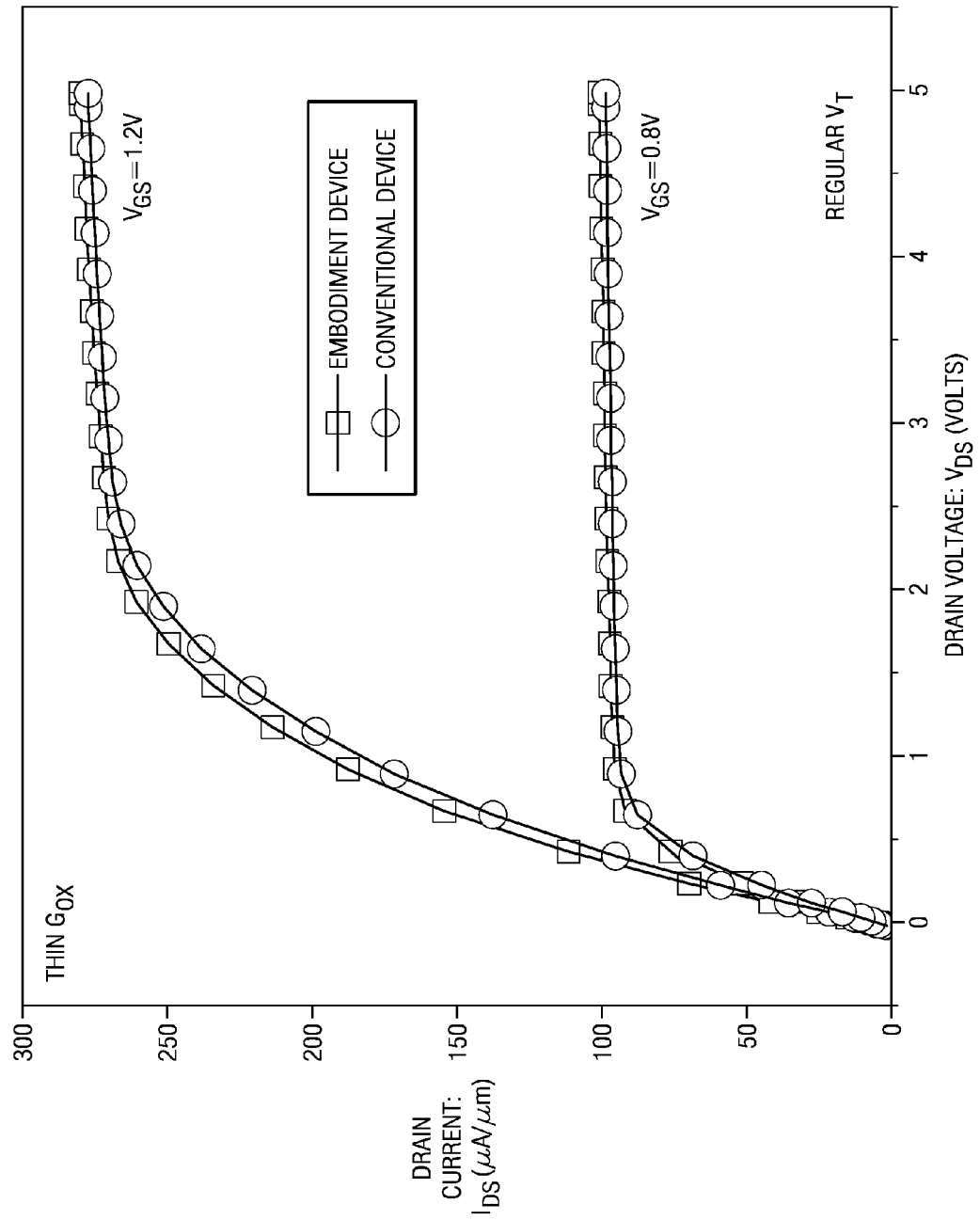
Figure 4D:
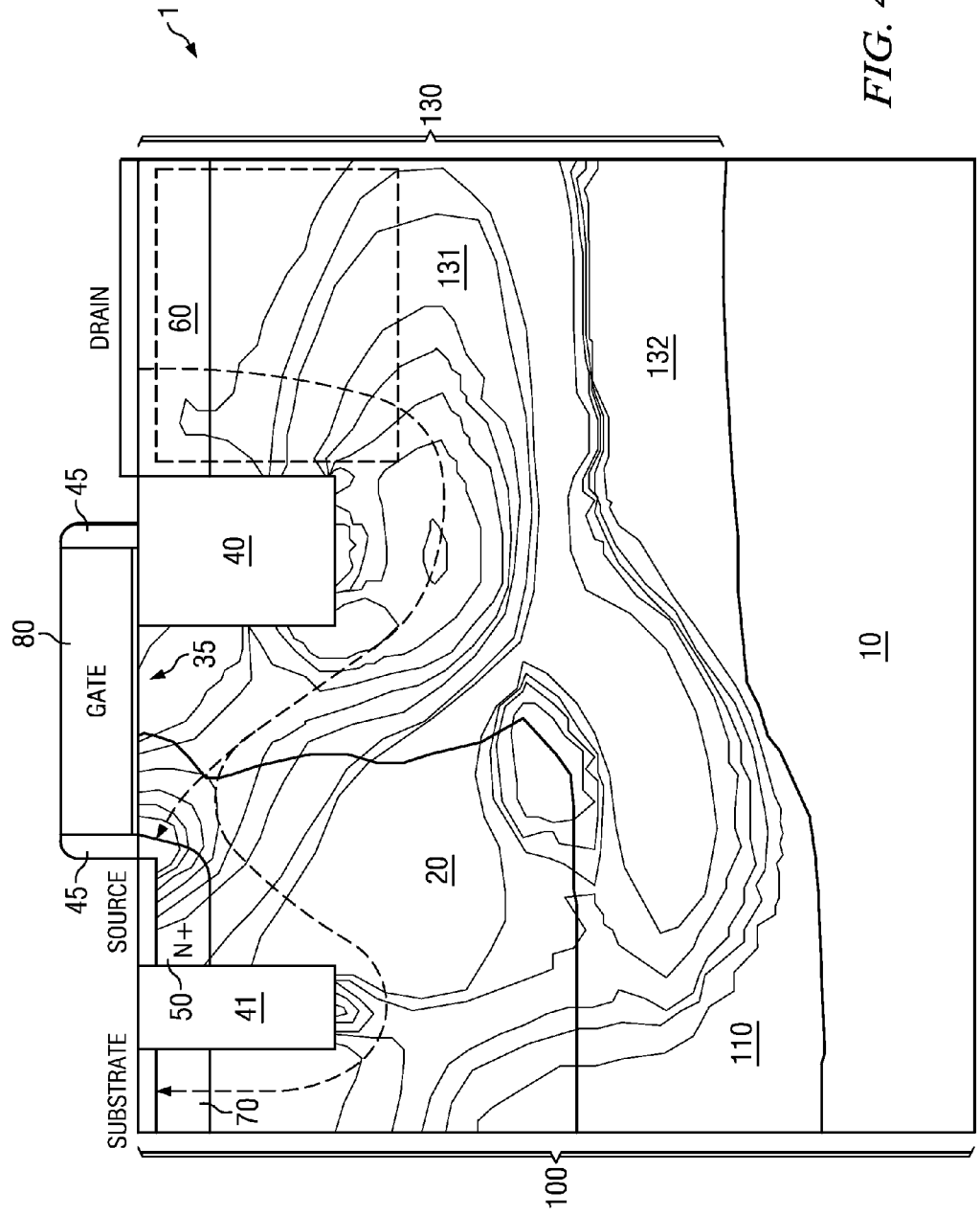
Figure 4E:
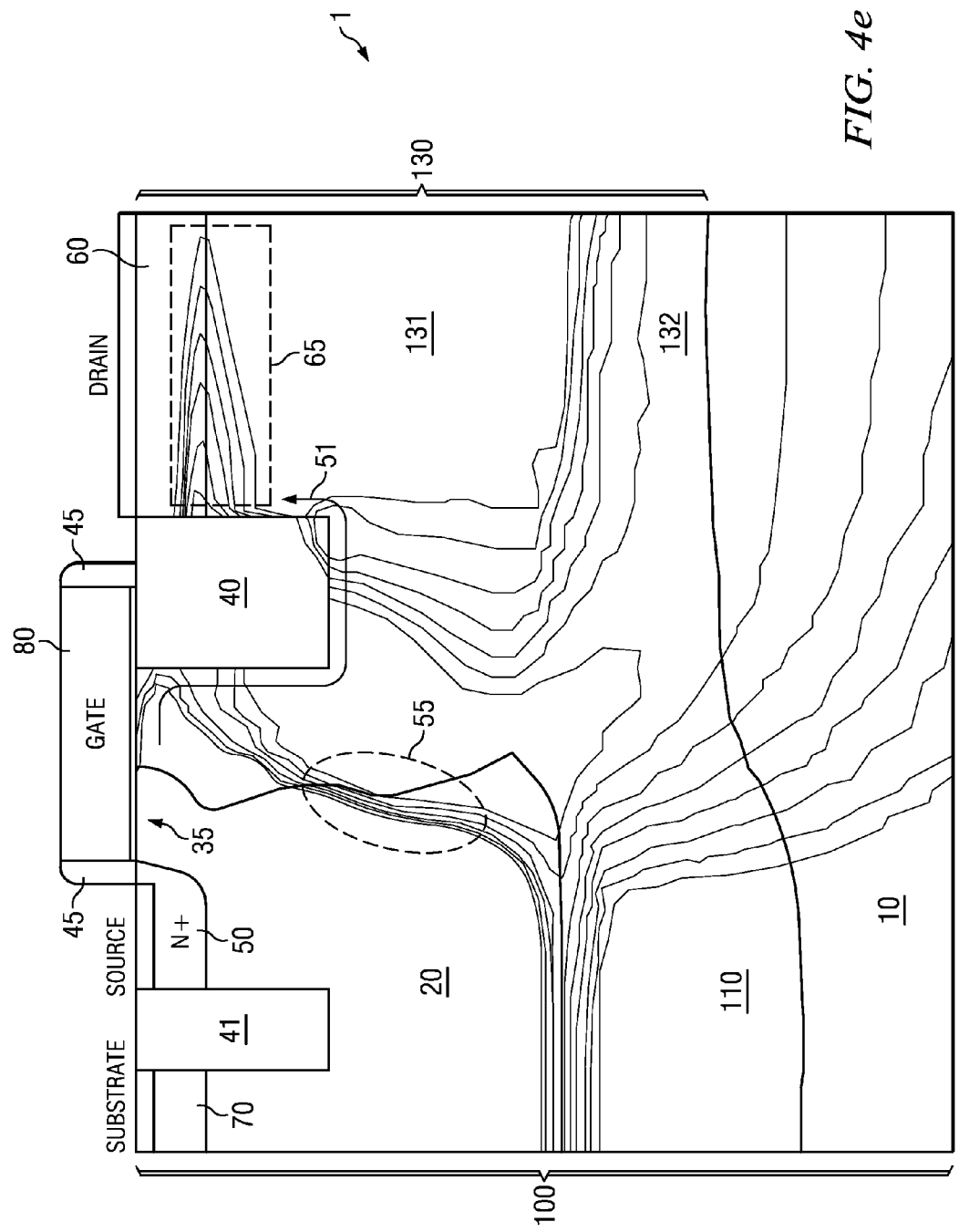

FIG. 4, which includes FIGS. 4a-4c, illustrates an alternative embodiment of the invention, wherein FIG. 4a illustrates a schematic cross sectional view, FIG. 4b illustrates experimental ESD and MOS operational data, FIG. 4c shows the Id-Vd curves under normal FET operation, FIG. 4d illustrates charge density profiles after simulating an ESD pulse using a TCAD device simulation, and FIG. 4e illustrates the electric fields corresponding to FIG. 4d.

As illustrated in FIG. 4a, the embodiment of FIG. 4 includes all the features described with respect to FIG. 3 but also includes an additional deep n-well region 110. The deep n-well region 110 is added to prevent latch up of the transistor (and/or to decouple the channel region 35 from the often noisy substrate) and does not change the operational aspects with respect to the ESD and normal MOS operation described above.

Referring to FIG. 4b, the plot of $I_{TLP}$ v. drain voltage of ESD stress shows the increase in drain voltage as the magnitude of the current pulse is increased. However, unlike the conventional device, the device using embodiments of the invention attain a much higher drain current $I_{TLP}$ (critical drain current $I'_{t2}$) before reaching similar (failing) drain voltage. However, the critical drain current $I_{t2}$ of the conventional device is at least 5× lower than the critical drain current $I'_{t2}$ of the embodiment.

The plot of $I_{TLP}$ v. leakage current illustrates this improvement. Unlike the conventional device which failed at around 20 mA, the embodiment device is immune from ESD stress up to 100 mA. Thus, the maximum ESD stress that the device can take before the device is permanently damaged is increased about five times using embodiments of the invention.

FIG. 4c illustrates the drain current $I_{DS}$ v. drain voltage $V_{DS}$ under MOS operation for two different gate voltages. As illustrated in the Figure, there is no significant difference in ON currents. For example, at a gate-source voltage of 1.2 V and at a drain-source voltage of 5.0V, the ON current of both is about 275 µA/µm.

FIG. 4d illustrates the charge density profiles across the DeMOS device of FIG. 4a under ESD stress.

The ESD pulse (100 ns) was simulated at a drain current $I_{TLP}$ of 2 mA/µm within the DeMOS transistor of FIG. 4a using a TCAD device simulator. The ESD pulse is applied to the drain of the DeMOS transistor and the charge density profiles are illustrated after the end of the stress pulse. The dashed arrow follows the peak of the current density. The charge flow is triggered at the junction between p-well region 20 and the first n-well region 131 and flows under the drain-sided isolation region 40. Unlike the simulation of the conventional device (FIG. 2b), using embodiments of the invention, the charge density is more relaxed (spread out) both under the drain-sided isolation region 40 and under the drain region 60. The peak charge density under the drain region 60 is much lower using embodiments of the invention than in the conventional device by about 4×.

As expected, the electric field profile (FIG. 4e) does not show high electric field region under/around the drain region 60 unlike the conventional device of FIG. 2c. Rather, the peak electric field is located at the p-well region 20/retrograde n-well 130 in the second region 55 and not in the first region 65 as in FIG. 2c.

Figure 5:
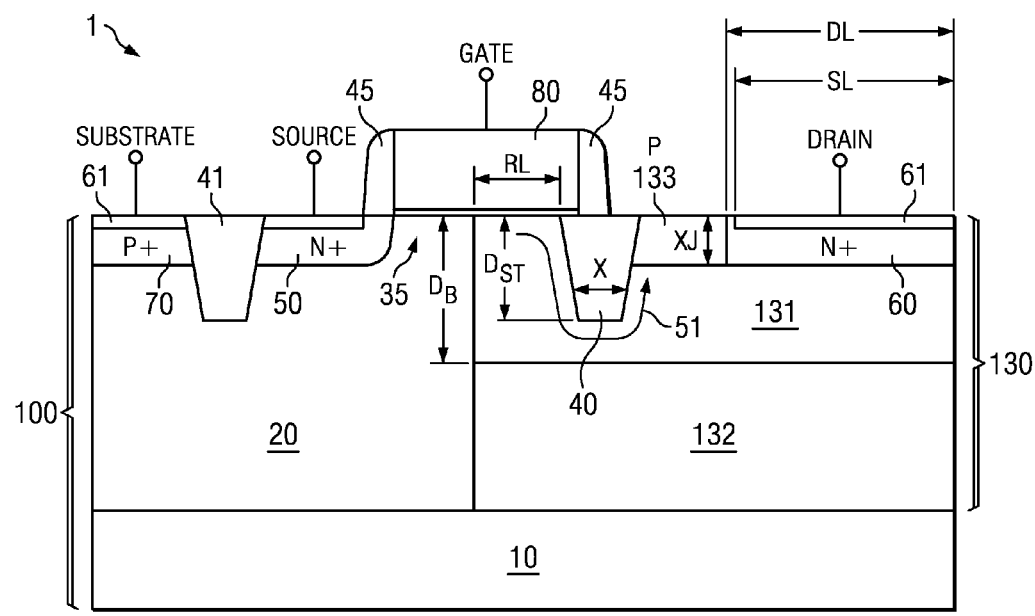
FIG. 5 is an alternative embodiment of the DeMOS transistor including a drain spacer layer to space out the drain region from the isolation region.

FIG. 5 is an alternative embodiment of the DeMOS transistor.

The DeMOS transistor is similar to the embodiment of FIG. 3 but additionally includes a drain spacer layer 133 adjacent the drain region 60. The drain spacer layer 133 may have the opposite doping as the source drain, and may be a p-type region for a n-channel DeMOS transistor. The drain spacer layer 133 may be doped to varying concentrations and may be a p⁻ region, a p region, or a p⁺ region. However, for a p-channel DeMOS transistor, the drain spacer layer 133 may be doped to be a n-type region. Having a region of opposite doping prevents peak current flow along the sidewalls of the drain-sided isolation region 40. However, in this embodiment care should be taken to prevent forming a contact to the drain spacer layer 133 or all the charge density flow will be steered into the small drain spacer layer 133. Therefore, to ensure that the drain spacer layer 133 is always a floating region, the length SL of the silicide region 61 should be less than the length DL of the drain region 60. This ensures that the silicide region 61 does not accidentally contact the drain spacer layer 133, e.g., due to misalignment errors. Therefore, in one embodiment, the drain spacer layer 133 may be covered by an isolation region (silicide block 46), e.g., a silicon nitride layer disposed adjacent the spacers 45. In other embodiments, the silicide block 46 may not be a spacer i.e. may not contact the spacer 45.

In some embodiments, the drain spacer layer 133 may be a counter-doped starting from the originally N+ doped layer to result in a p-type doped region or may also be an intrinsic region. In such embodiments, the n+ doping of the drain region is moved away from the drain-sided isolation region 40 thereby partially pushing out the current from the sidewalls of the drain-sided isolation region 40 thereby reducing the magnitude of the charge density peaks adjacent the drain-sided isolation region 40 compared to the embodiment of FIG. 3.

Figure 6:
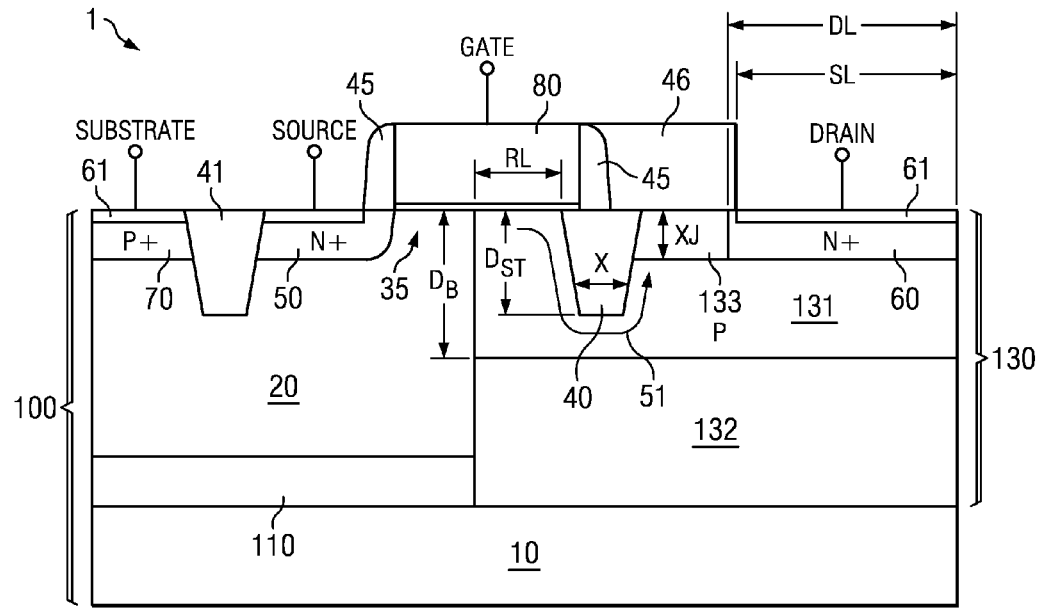
FIG. 6 illustrates another embodiment of a DeMOS transistor including a drain spacer layer adjacent the drain region and a deep n-region under the p-well region.

FIG. 6 illustrates another embodiment of FIG. 4 having a drain spacer layer 133 as in FIG. 5 but also including the deep n-well region 110.

This embodiment is functionally similar with respect to the ESD stress immunity as the embodiment of FIG. 5.

Figure 7:
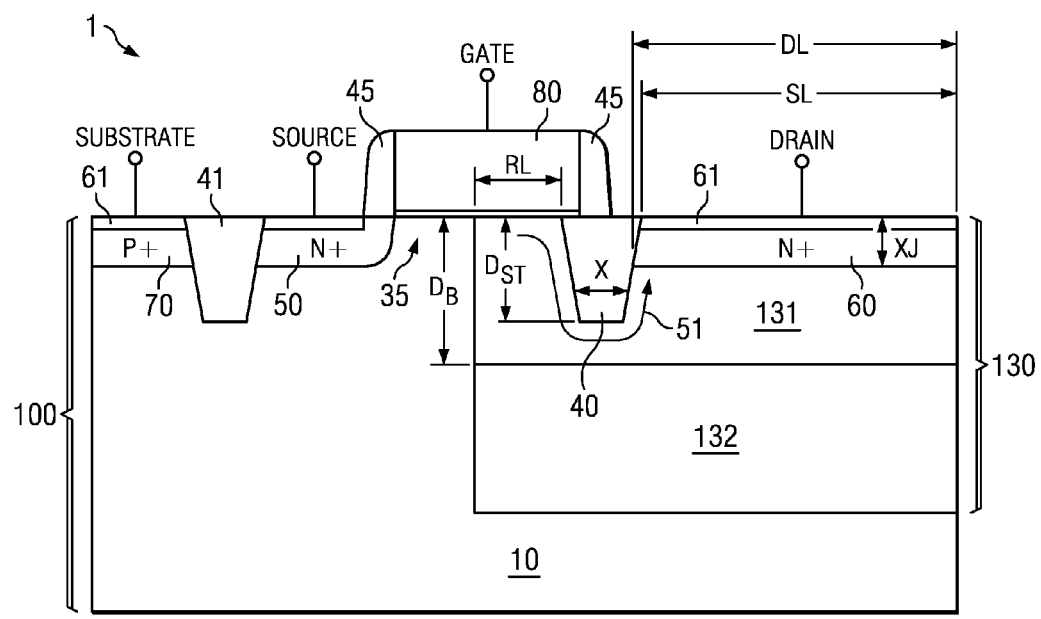
FIG. 7 illustrates an embodiment of a DeMOS transistor having no separate p-well region.

FIG. 7 illustrates an embodiment of a DeMOS transistor having no separate p-well region. Rather, in this embodiment, the channel region 35 of the DeMOS transistor 1 is formed within the p-body region 10 without forming a separate p-well region 20 (as in FIG. 3). The operation of this DeMOS transistor 1 is similar to that described with respect to FIG. 3.

Figure 8:
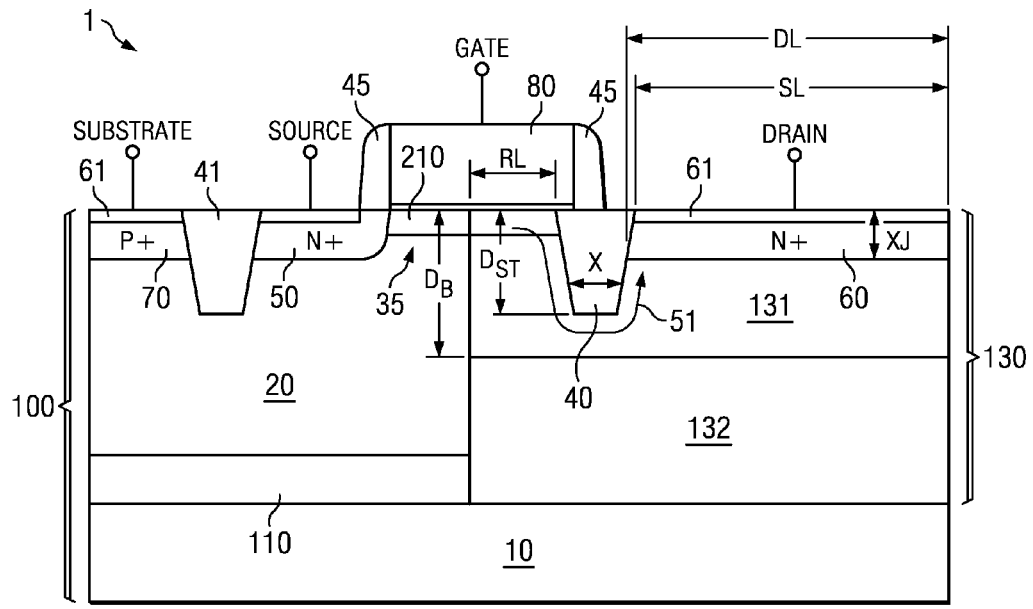
FIG. 8 illustrates an alternative embodiment of a DeMOS transistor having a hetero-epitaxial channel region.

FIG. 8 illustrates an alternative embodiment of a DeMOS transistor having a hetero-epitaxial layer 210. In one embodiment, the region under the gate, which is the hetero-epitaxial layer 210, comprises an epitaxial SiGe layer so that the channel region 35 comprises SiGe. The SiGe layer may be used to improve carrier mobility for improving the performance of the MOS transistor. In alternative embodiments, the hetero-epitaxial layer 210 may comprise Ge, or III-V materials such as InSb, InP etc.

Figure 9:
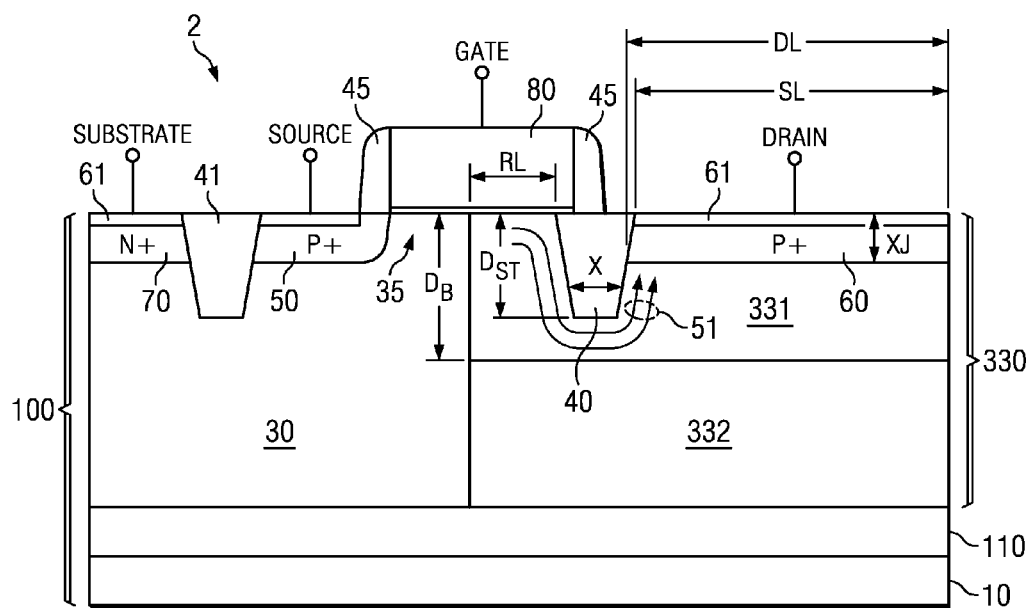
FIG. 9 illustrates a p-channel DeMOS transistor in accordance with an embodiment of the invention.

FIG. 9 illustrates a p-channel DeMOS transistor in accordance with an embodiment of the invention.

Although the embodiments of FIGS. 3-8 have been described with respect to re-channel DeMOS transistors, the various embodiments described so far can be applied to p-channel DeMOS transistors as well. As an example, FIG. 9 illustrates a p-channel DeMOS transistor 2 having a retrograde p-well 330.

The p-channel DeMOS transistor 2 comprises a deep n-well region 110 formed over a p-body region 10 of the substrate 100. Isolation regions comprising drain-sided isolation region 40 and other isolation regions 41 are formed within the substrate 100 as in prior embodiments. An n-well region 30 is disposed within the substrate 100 over the deep n-well region 110. The channel region 35 of the p-channel DeMOS transistor 2 is formed within the n-well region 30.

A source region 50 having a p+ doping is disposed within the n-well region 30 of the substrate 100. A drain region 60 having a p+ doping is disposed within the retrograde p-well 330 of the substrate 100. A contact region 70 having a n+ doping is disposed within the n-well region 30 to contact the n-well region 30. As in previous embodiments, a gate 80 is disposed between the source region 50 and the drain region 60, and spacers 45 are disposed over the sidewalls of the gate 80 and contact the sidewalls of the gate 80. A silicide region 61 is disposed on the drain region 60.

The p-well retrograde well 330 comprises a first p-well region 331 having a doping $N_{INT}$ and a second p-well region 332 having a doping $N_B$. The doping $N_{INT}$ of the first p-well region 331 is lower than the doping $N_B$ of the second p-well region 332 thereby forming the retrograde p-well 330.

As in prior embodiments, the retrograde doping of the p-well retrograde well 330 distributes more of the charge carriers into the second p-well region 332 so as to relocate the electric field region from the drain region 60 back to the n-well region 30/second p-well region 332.

The layout and doping rules are similar to the n-channel DeMOS transistors described above in various embodiments. These are briefly repeated again below for convenience.

In various embodiments, the ratio of the doping $N_B$ of the second p-well region 332 to the doping $N_{INT}$ of the first p-well region 331 is at least 3:1, and about 10:1 in one embodiment. In various embodiments, the doping of the n-well region 30 is about $5 \times 10^{16}$ cm$^{-3}$ to about $10^{18}$ cm$^{-3}$, the doping $N_{INT}$ of the first p-well region 331 is about $1 \times 10^{17}$ cm$^{-3}$ to about $5 \times 10^{18}$ cm$^{-3}$, the doping $N_B$ of the second p-well region 332 is about $10^{18}$ cm$^{-3}$ to about $5 \times 10^{19}$ cm$^{-3}$.

As described above, the depth $D_{ST}$ of the drain-sided isolation region 40 should be greater than the junction XJ of the drain region 60, the length DL of the drain region 60 should be greater than the depth $D_{ST}$ of the drain-sided isolation region 40, the depth $D_B$ of the first n-well region 131 should be greater than the depth $D_{ST}$ of the drain-sided isolation region 40, and the depth $D_{ST}$ of the drain-sided isolation region 40 may be greater than the width X of the drain-sided isolation region 40. In various embodiments, the length SL of the silicide region 61 is about the same as the length DL of the drain region 60.

Embodiments of the p-channel transistor 2 may also include the embodiments described with respect to FIGS. 5-8. For example, a drain spacer layer having a n-type region may be used to push the p+ drain region 60 of the p-channel transistor 2 away from the drain-sided isolation region 40.

Figure 10A:
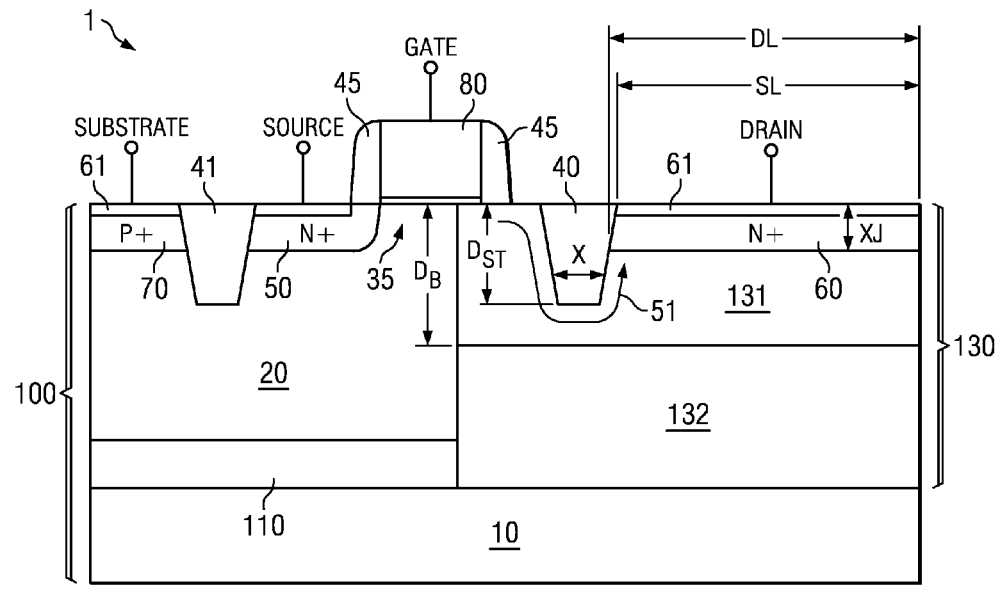
FIGS. 10a-10c, illustrates further embodiments of the DeMOS device.
Figure 10B:
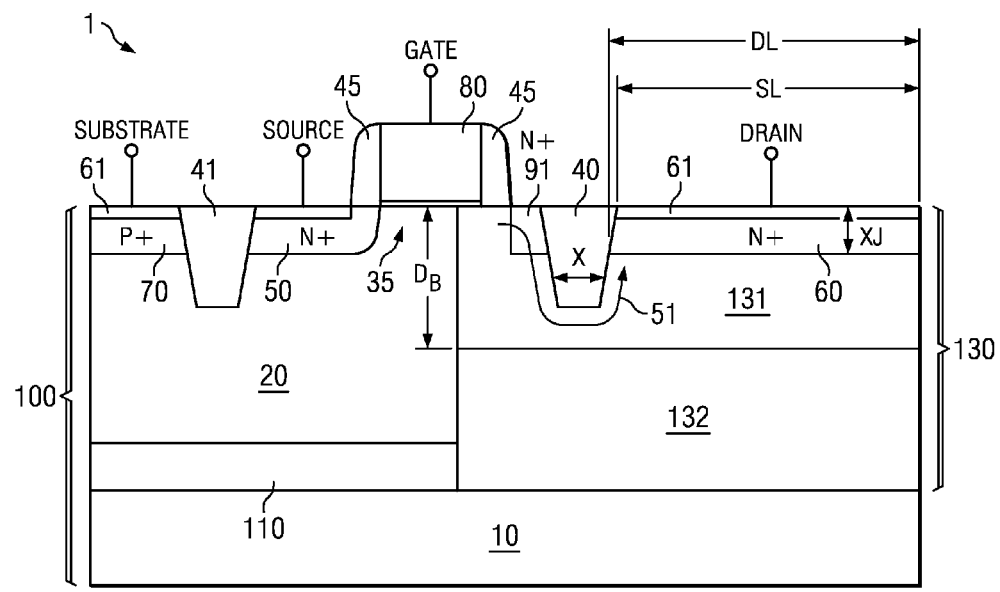
Figure 10C:
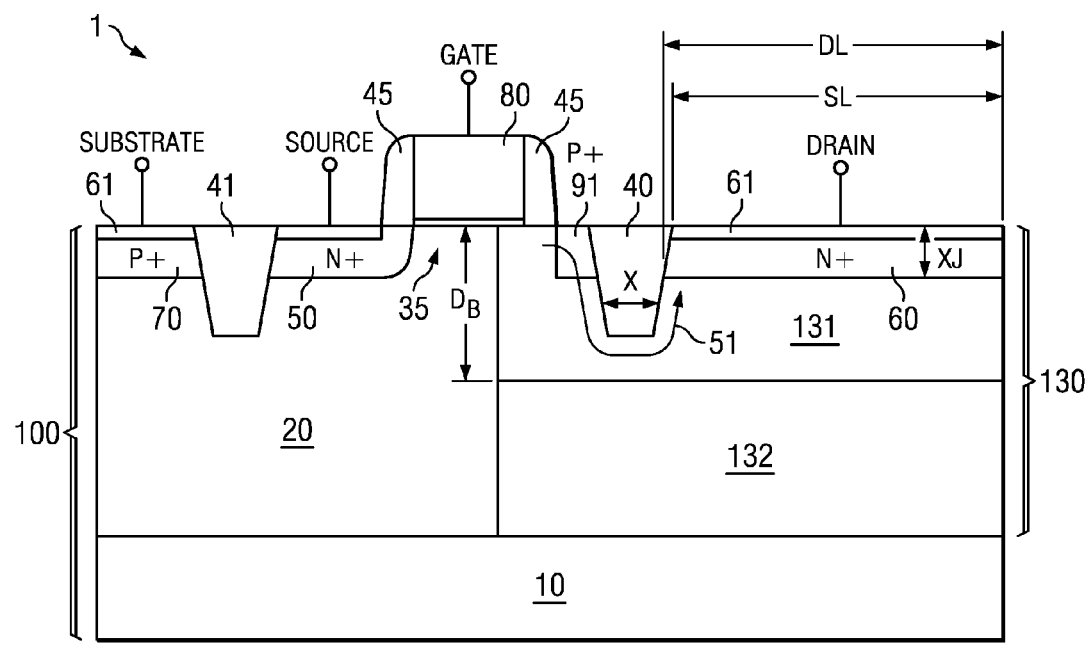

FIG. 10, which includes FIGS. 10a-10c, illustrates further embodiments of the DeMOS device.

FIG. 10a illustrates an embodiment of the invention in which the gate 80 and/or the spacer 45 does not overlap the top surface of the drain-sided isolation region 40. The embodiment helps to move the carrier flow away from the sidewalls of the drain-sided isolation region 40 thereby preventing high charge density regions, which may be vulnerable to breakdown.

FIG. 10b illustrates an alternative embodiment including a gate spacer region 91. In this embodiment, the gate spacer region 91 is formed having the same doping type as the drain region 60. The gate spacer region 91 is a floating region in that it is not coupled to a contact (any metallization, or any silicide). The heavier doping of the gate spacer region 91 relative to the first n-well region 131 prevents charge depletion near the drain-sided isolation region 40 thereby reducing parasitic effects.

FIG. 10c illustrates an alternative embodiment having a gate spacer region 91. In this embodiment and unlike the embodiment of FIG. 10b, the gate spacer region 91 is formed having the opposite doping type as the drain region 60. Again, the gate spacer region 91 is a floating region in that it is not coupled to a contact (any metallization). The heavier doping of the gate spacer region 91 relative to the first n-well region 131 prevents carrier flow adjacent the edge of the drain-sided isolation region 40.

Figure 11:
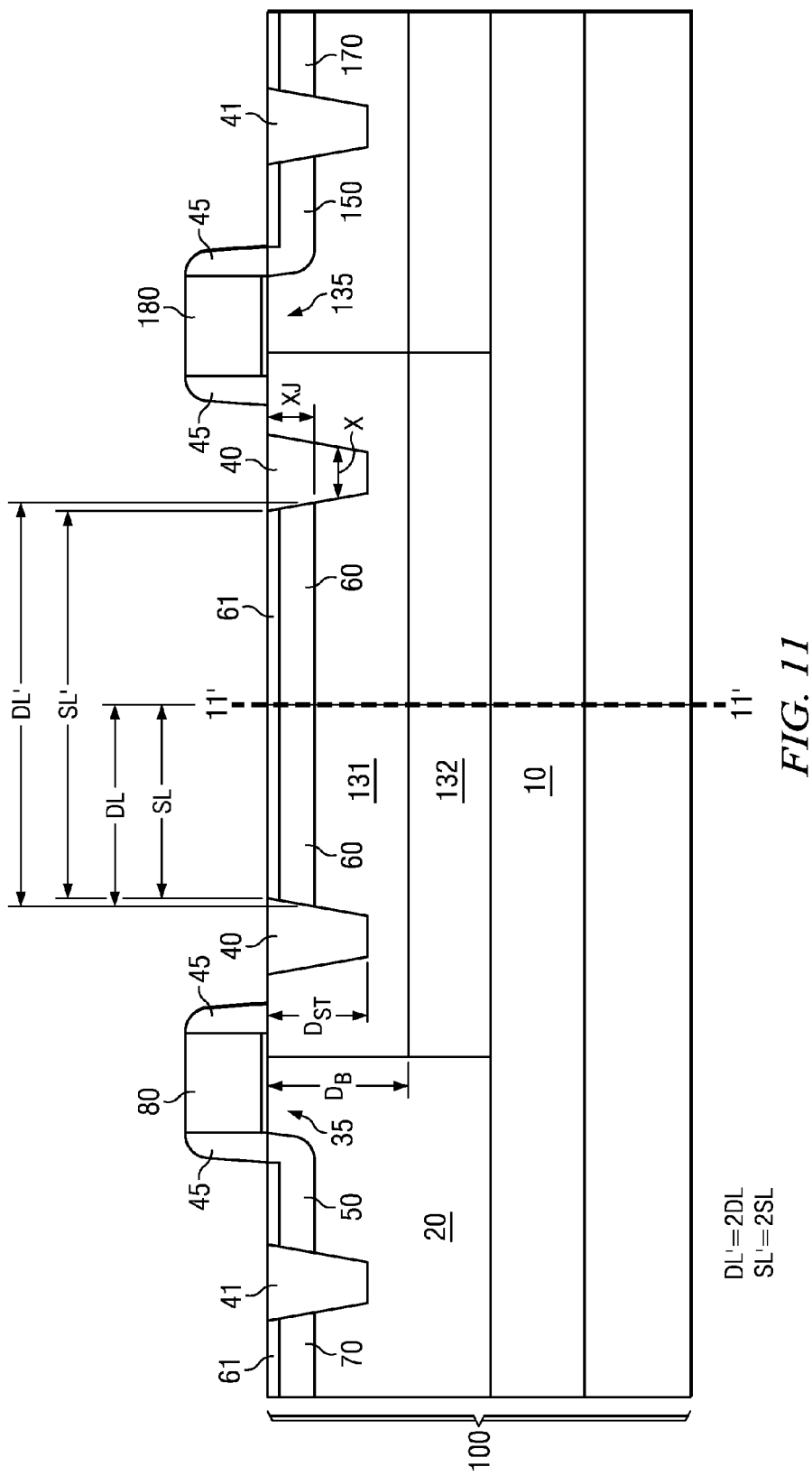
FIG. 11 illustrates another embodiment of the invention having multiple finger structures.

FIG. 11 illustrates another embodiment of the invention having multiple finger structures. While not separately illustrated embodiments of the devices described above, for example FIGS. 3, 4, 5-9, 10 also include devices having shared drain regions. In such embodiments, the device has a mirror symmetry along a vertical line, for example, along line 11' in FIG. 11. In such embodiments, the device includes two channel regions: a channel region 35 formed within the p-well region 20, and another channel region 135 formed within the other p-well region 120, which is coupled through another substrate contact region 170. The other channel region 135 is coupled to another source region 150. Thus the device has at least two gates: a gate 80 and another gate 180 as illustrated. As illustrated in FIG. 11, and as described above in various embodiments, the depth $D_{ST}$ of the drain-sided isolation region 40 should be greater than the junction depth XJ of the drain region 60, the depth $D_B$ of the first n-well region 131 should be greater than the depth $D_{ST}$ of the drain-sided isolation region 40, and the depth $D_{ST}$ of the drain-sided isolation region 40 may be greater than the width X of the drain-sided isolation region 40. In various embodiments, the full-length SL' of the silicide region 61 is about the same as the full-length DL' of the drain region 60. Because the drain region 60 is a shared drain of two DeMOS transistors, the half-length DL of the drain region 60 should be greater than the depth $D_{ST}$ of the drain-sided isolation region 40 so that the full-length DL' of the drain region 60 should be greater than twice the depth $D_{ST}$ of the drain-sided isolation region 40.

FIG. 12, which includes FIGS. 12a-12g, illustrates a method of manufacturing the DeMOS transistor in accordance with embodiments of the invention.

As an illustration, a process flow for manufacturing a n-channel DeMOS transistor is described, however, the same methods may be applied to a p-channel DeMOS transistor.

Figure 12A:
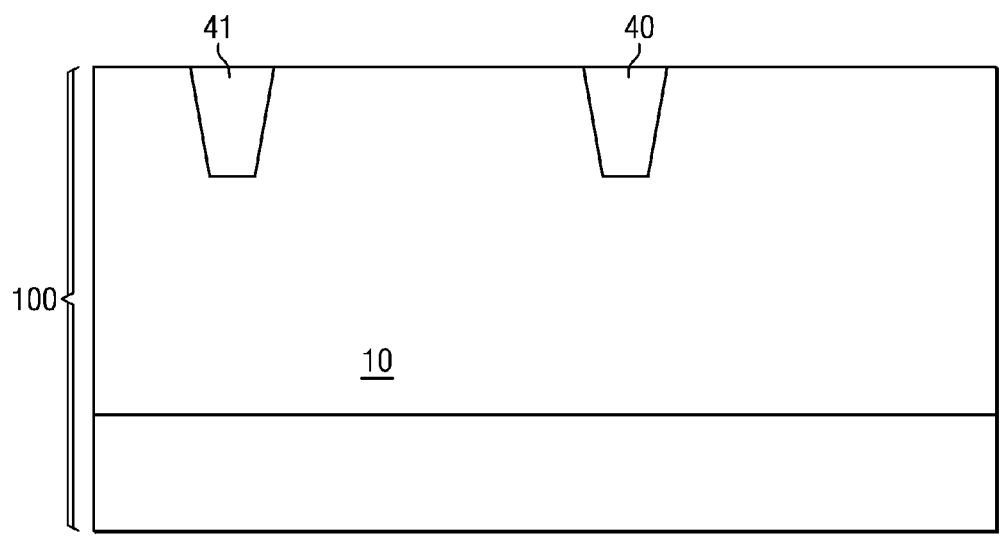

Referring to FIG. 12a, a p-body region 10 is formed within the substrate 100. The substrate 100 may include a silicon bulk substrate or a silicon on insulator substrate. The substrate 100 may include epitaxial layers over a bulk crystalline semiconductor material.

Isolation regions comprising drain-sided isolation region 40 and other isolation regions 41 are formed within the substrate 100. The isolation regions may be formed using shallow trench isolation technology in one embodiment, or deep trench isolation in some embodiments.

Figure 12B:
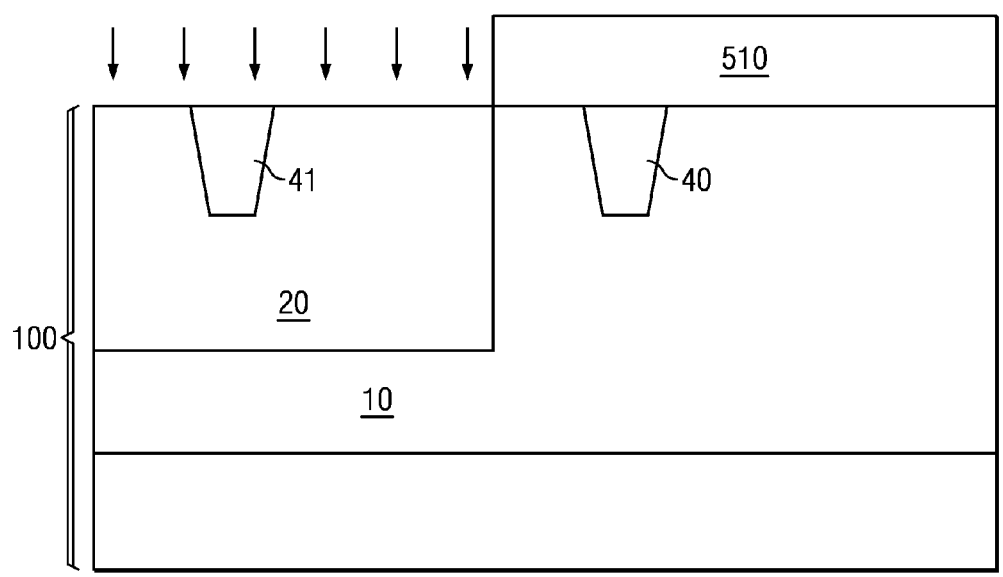

Referring to FIG. 12b, a p-well region 20 is formed within the p-body region 10. The p-well region 20 may be formed using an implantation step, which follows masking of a portion of the substrate 100. For example, a first mask layer 510 may be formed using lithography techniques. A p-type dopant, e.g., boron, is implanted into the substrate 100. An optional anneal may be used to activate the dopants forming the p-well region 20. In some embodiments, the well anneal may be performed after implanting all the required wells within the substrate 100.

Figure 12C:
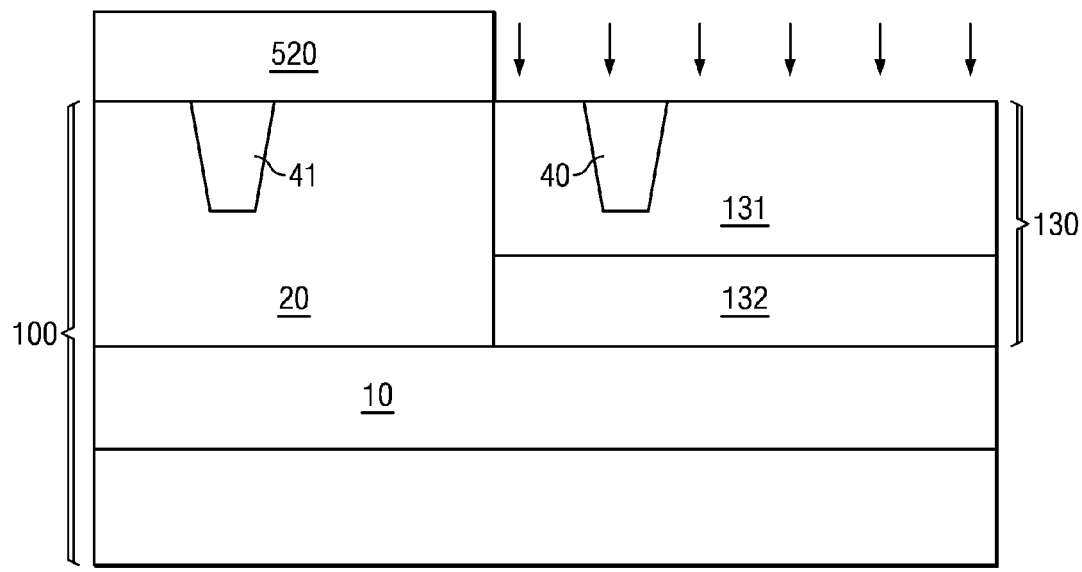

As illustrated in FIG. 12c, a retrograde well 130 is next formed within the substrate. The first mask layer 510 is removed and a new mask material is coated over the substrate 100. Using lithography the mask material is patterned forming a second mask layer 520.

Next, n-type dopants e.g., phosphorus, arsenic, and/or antimony, are implanted into the opening forming the retrograde n-well 130. In various embodiments, n-type dopant implantation is performed in at least two steps. In a first step, n-type dopants at a first energy and a first dose are implanted to form a first n-well region 131 having a peak doping of $N_{INT}$.

In a second step, n-type dopants at a second energy and a second dose may be implanted to form a second n-well region 132 having a doping $N_B$. The first and the second steps may be performed in any order. In various embodiments, the first energy is about 50 keV to about 300 keV of phosphorus, the second energy is about 200 keV to about 1 MeV of phosphorus. The first dose is about $5\times10^{12}$ cm$^{-2}$ to about $10^{14}$ cm$^{-2}$, and the second dose is about $5\times10^{13}$ cm$^{-2}$ to about $5\times10^{14}$ cm$^{-2}$. The implant doses and energies of the first and the second implant are selected so as to satisfy the condition that the peak doping $N_B$ of the second n-well region 132 is less than the peak doping $N_{INT}$ of the first n-well region 131.

The substrate 100 is annealed to remove the implanted damage and activate the dopants. The well anneal may form both the retrograde n-well 130 and the p-well region 20 in various embodiments. In various embodiments, the well anneal may be a high temperature rapid thermal anneal, for example, between about 900° C. to about 1100° C., and greater than or equal to 1000° C. in one example embodiment. In some embodiments, the well anneal may also be a furnace anneal having a longer anneal time. For example, in one embodiment, a 10 s anneal at 1000° C. may be performed. The second mask layer 520 may be removed prior to or after the well anneal.

Figure 12D:
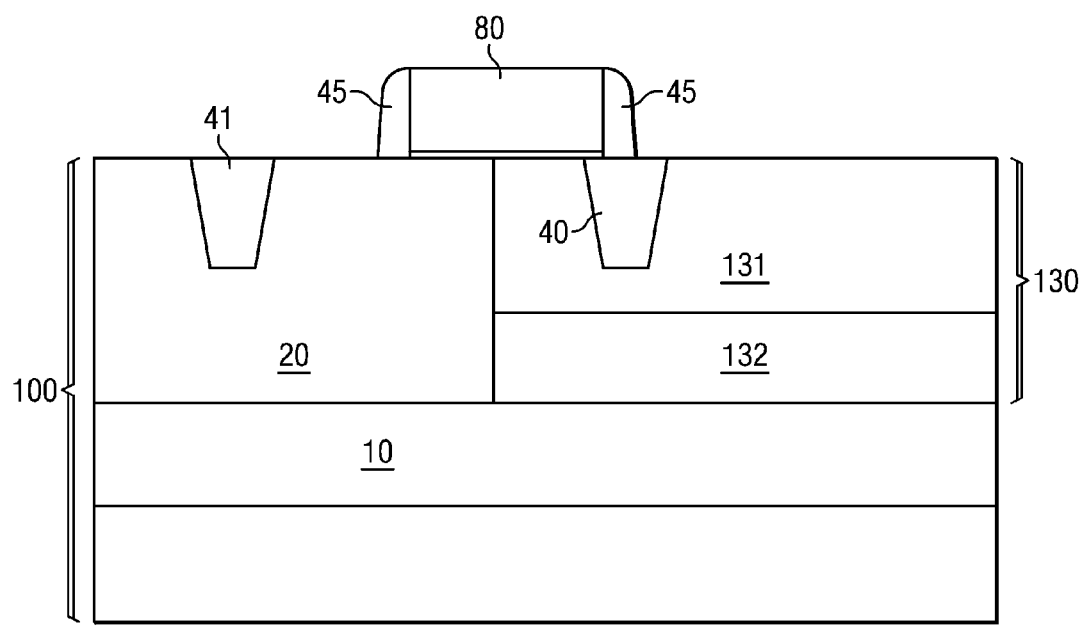

As next illustrated in FIG. 12d, a gate stack comprising a gate 80 and a gate dielectric is formed over the substrate 100.

The gate dielectric may comprise a plurality of layers, and may be an oxide, a nitride, an oxynitride, and/or a high-k dielectric material. The gate 80 may comprise a polysilicon material in one embodiment. In other embodiments, the gate 80 may comprise a metallic material. The gate 80 is formed by depositing a gate material and patterning them into gate lines. Spacers 45 are formed adjacent the gate 80 over the sidewalls of the gate 80. The spacers 45 may comprise a single layer or may be a plurality of layers of a same material or different materials.

Figure 12E:
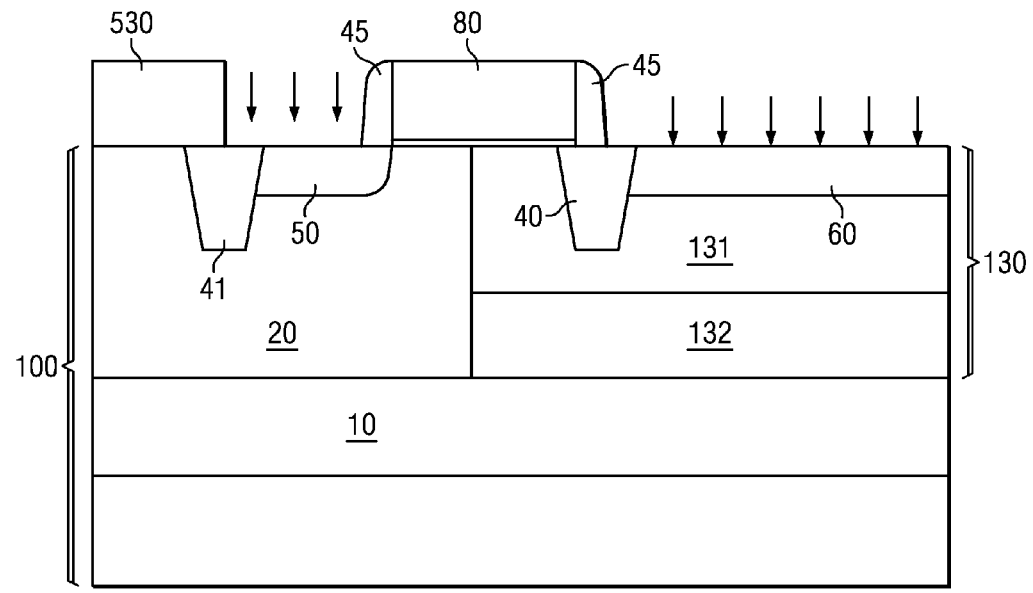

Referring next to FIG. 12e, a source region 50 and a drain region 60 are formed. A substrate contact region is masked during this step, for example, using a third mask layer 530. The source and the drain regions 50 and 60 may be formed by implanting a low energy n-type dopant into the substrate 100. For example, arsenic ions at an energy of about 10 keV to about 50 keV may be implanted to form the source region 50 and the drain region 60. In other embodiments, phosphorus ions at an energy of about 5 keV to about 30 keV may be implanted. In various embodiments, both phosphorus and arsenic may be both implanted to form the source region 50 and the drain region 60. The implant dose may be about $10^{14}$ cm$^{-2}$ to about $5\times10^{15}$ cm$^{-2}$. The gate 80 may also be implanted at this time in some embodiments. In one of the other examples, the source and the drain regions 50 and 60 may be formed by epitaxial growth of Si, SiGe, SiC on top of the substrate 100. Such embodiments may include a raised structure (raised source/drain) wherein a top surface of the source and the drain regions 50 and 60 is above the top surface of the substrate 100.

Figure 12F:
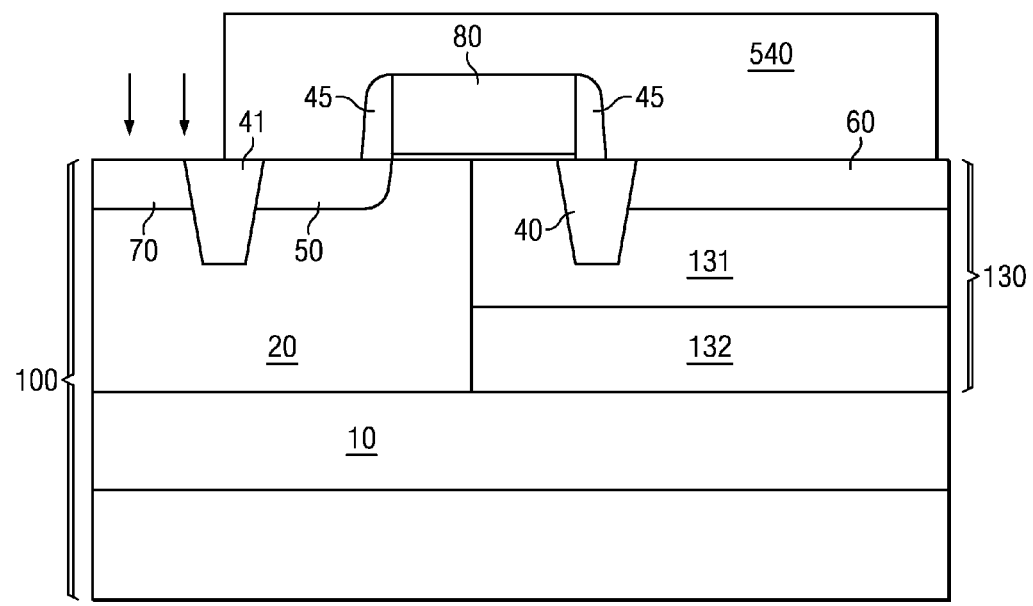

As next illustrated in FIG. 12f, the third mask layer 530 is removed and replaced with a fourth mask layer 540 thereby opening the substrate contact region. An implant of p-type dopants may be performed into the substrate 100 thereby forming the substrate contact region 70 within the p-well region 20.

A source/drain activation anneal may follow the implantations to activate the dopants in the source region 50, the drain region 60, and the substrate contact region 70, and optionally also the gate 80. The source/drain activation anneal may be a high temperature rapid thermal anneal including a spike anneal, a millisecond anneal such as a flash anneal, less than millisecond anneals such as laser anneals, and/or combinations such as flash assisted spike anneals. In one embodiment, the source/drain activation anneal comprises a spike anneal of at least 900° C. for less than about 1 s. In another embodiment, the source/drain activation anneal may include a millisecond anneal of at least 1000° C.

As illustrated in FIG. 12g, a silicide region 61 is formed. As described above, in some embodiments, the silcide region 61 has a different size than the underlying drain region 60 (e.g., FIG. 6). In such embodiments, an optional silicide block is formed over regions of the drain region 60 that are not to be silicided. In one example embodiment, a nitride layer may be deposited and patterned forming a silicide block before depositing a metal for silicidation. In one example embodiment, the nitride may be formed as an additional spacer over the spacers 45. A metal such as nickel or cobalt may be deposited over the exposed source region 50, the drain region 60, the substrate contact region 70, and the gate 80. An appropriate anneal is performed to convert a portion of the semiconductor in the substrate 100 into a silicide material. Excess metal is removed leaving the silicide region 61.

Further processing may continue as in conventional semiconductor processing, for example, to form contacts and interconnects.

FIG. 13 illustrates possible ranges for each of the parameters described above with respect to FIGS. 3-11 calculated in accordance with an embodiment of the invention.

For example, at the 20 nm technology node, as illustrated, a depth of the drain region may be about 50 nm to about 60 nm, a depth of the isolation region may be about 200 nm to about 240 nm, a depth of the shallower layer may be about 220 nm to about 260 nm, the length of the drain region may be greater than about 500 nm, the first peak doping may be about $4\times10^{17}$ cm$^{-3}$ to about $6\times10^{17}$ cm$^{-3}$, and the second peak doping may be about $2\times10^{18}$ cm$^{-3}$ to about $3\times10^{18}$ cm$^{-3}$.

In another example embodiment, at the 32 nm technology node, a depth of the drain region may be about 70 nm to about 80 nm, a depth of the isolation region may be about 270 nm to about 310 nm, a depth of the shallower layer may be about 290 nm to about 330 nm, the length of the drain region may be greater than about 600 nm, the first peak doping may be about $3\times10^{17}$ cm$^{-3}$ to about $5\times10^{17}$ cm$^{-3}$, and the second peak doping may be about $1\times10^{18}$ cm$^{-3}$ to about $2\times10^{18}$ cm$^{-3}$.

In another example embodiment, in a highly scaled technology, a depth of the drain region may be about 30 nm to about 40 nm, a depth of the isolation region may be about 170 nm to about 210 nm, a depth of the shallower layer may be about 190 nm to about 230 nm, the length of the drain region may be greater than about 400 nm, the first peak doping may be about $5\times10^{17}$ cm$^{-3}$ to about $7\times10^{17}$ cm$^{-3}$, and the second peak doping may be about $3\times10^{18}$ cm$^{-3}$ to about $4\times10^{18}$ cm$^{-3}$.

The assignment of the technology nodes is used only for illustration. In various embodiments, DEMOS devices built on prior technology node may be scaled more and may look more like a lower node. Similarly, in various embodiments, DEMOS devices built on a newer technology node may be scaled less and may look more like a prior technology node device.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a first region having a first doping type disposed in a substrate;
   a channel region having the first doping type disposed in the first region;
   a retrograde well having a second doping type disposed in the substrate, the second doping type being opposite to the first doping type, the retrograde well having a shallower layer of a first peak doping and a deeper layer of a second peak doping higher than the first peak doping;
   a drain region having the second doping type disposed in the substrate over the retrograde well;
   an extended drain region disposed in the retrograde well coupling the channel region with the drain region, the extended drain region comprising a gate overlap region;
   an isolation region disposed in the retrograde well, the isolation region being disposed between the gate overlap region of the extended drain region and the drain region, wherein a length of the drain region is greater than a depth of the isolation region; and
   a drain spacer layer having the first doping type disposed laterally adjacent the drain region between the isolation region and the drain region.

2. The device of claim 1, further comprising:
   a source region disposed in a substrate; and
   a gate disposed over the substrate between the source region and the drain region.

3. The device of claim 1, wherein the isolation region extends deeper into the substrate than the drain region.

4. The device of claim 1, wherein the shallower layer extends deeper into the substrate than the isolation region.

5. The device of claim 1, wherein a depth of the isolation region is greater than a lateral width of the isolation region.

6. The device of claim 1, further comprising a silicide region disposed over the drain region, wherein a surface area of the silicide region is about the same as a surface area of the drain region.

7. The device of claim 1, wherein an exposed top surface of the drain spacer layer is covered by an insulating material so that the drain spacer layer is separated from a metallic material by an insulating material region or a semiconductor region.

8. The device of claim 7, further comprising a silicide region disposed over the drain region, wherein the silicide region is spaced away from the drain spacer layer.

9. The device of claim 1, wherein the semiconductor device is a n-channel drain extended metal oxide semiconductor (DeMOS) transistor, wherein the drain region comprises heavily doped n$^+$regions, and wherein the retrograde well is an n-type region.

10. The device of claim 1, wherein the semiconductor device is a p-channel drain extended metal oxide semiconductor (DeMOS) transistor, wherein the drain region comprises heavily doped p$^+$regions, and wherein the retrograde well is a p-type region.

11. The device of claim 1, wherein the channel region comprises a hetero epitaxial semiconductor material different from the material of the substrate.

12. The device of claim 1, further comprising a gate spacer region between the gate and the isolation region, wherein an exposed top surface of the gate spacer region is covered by an insulating material so that the gate spacer region is separated from a metallic material by an insulating material region or a semiconductor region.

13. The device of claim 12, wherein the gate spacer region is intrinsic or has a first doping type.

14. The device of claim 12, wherein the gate spacer region has a second doping type.

15. The device of claim 1, further comprises:
a second region having the first doping type disposed in the substrate;
another channel region having the first doping type disposed in the second region;
another extended drain region disposed in the retrograde well coupling the another channel region with the drain region, the other extended drain region comprising another gate overlap region; and
another isolation region disposed between the other gate overlap region of the other extended drain region and the drain region, wherein a length of the drain region is greater than two times the depth of the other isolation region.

16. A semiconductor device comprising:
a first region having a first doping type disposed in a substrate;
a channel region having the first doping type disposed in the first region;
a retrograde well having a second doping type disposed in the substrate the second doping type being opposite to the first doping type, the retrograde well having a shallower layer of a first peak doping and a deeper layer of a second peak doping higher than the first peak doping;
a drain region having the second doping type disposed in the substrate over the retrograde well;
an extended drain region disposed in the retrograde well coupling the channel region with the drain region, the extended drain region comprising a gate overlap region; and
an isolation region disposed between the gate overlap region of the extended drain region and the drain region, wherein a length of the drain region is greater than a depth of the isolation region, wherein a depth of the drain region is about 90 nm to about 100 nm, a depth of the isolation region is about 330 nm to about 370 nm, a depth of the shallower layer is about 350 nm to about 400 nm, the length of the drain region is greater than about 700 nm, the first peak doping is about $2\times10^{17} cm^{-3}$ to about $4\times10^{17} cm^{-3}$, and the second peak doping is about $1\times10^{18} cm^{-3}$ to about $2\times10^{18} cm^{-3}$.

17. A semiconductor device comprising:
a first region having a first doping type disposed in a substrate;
a channel region having the first doping type disposed in the first region;
a retrograde well having a second doping type disposed in the substrate, the second doping type being opposite to the first doping type, the retrograde well having a shallower layer of a first peak doping and a deeper layer of a second peak doping higher than the first peak doping;
a drain region having the second doping type disposed in the substrate over the retrograde well;
an extended drain region disposed in the retrograde well coupling the channel region with the drain region, the extended drain region comprising a gate overlap region; and
an isolation region disposed between the gate overlap region of the extended drain region and the drain region, wherein a length of the drain region is greater then a depth of the isolation region, wherein a depth of the drain region is about 60 nm to about 70 nm, a depth of the isolation region is about 230 nm to about 270 nm, a depth of the shallower layer is about 250 nm to about 290 nm, the length of the drain region is greater than about 550 nm, the first peak doping is about $3\times10^{17\ cm-3}$ to about $5\times10^{17\ cm-3}$, and the second peak doping is about $2\times10^{18\ cm-3}$ to about $3\times10^{18\ cm-3}$.

18. A semiconductor device comprising:
a first region having a first doping type disposed in a substrate;
a channel region having the first doping type disposed in the first region;
a retrograde well having a second doping type disposed in the substrate, the second doping type being opposite to the first doping type, the retrograde well having a shallower layer of a first peak doping and a deeper layer of a second peak doping higher than the first peak doping;
a drain region having the second doping type disposed in the substrate over the retrograde well;
an extended drain region disposed in the retrograde well coupling the channel region with the drain region, the extended drain region comprising a gate overlap region; and
an isolation region disposed between the gate overlap region of the extended drain region and the drain region, wherein a length of the drain region is greater than a depth of the isolation region, wherein a depth of the drain region is about 40 nm to about 50 nm, a depth of the isolation region is about 180 nm to about 220 nm, a depth of the shallower layer is about 200 nm to about 240 nm, the length of the drain region is greater than about 450 nm, the first peak doping is about $4\times10^{17\ cm-3}$ to about $6\times10^{17\ cm-3}$, and the second peak doping is about $2\times10^{18}\ cm^{-3}$ to about $3\times10^{18\ cm-3}$.

19. A drain extended field effect transistor comprising:
a first region having a first doping type disposed in a substrate;
a source region disposed in or above the first region;
a retrograde well having a second doping type disposed in the substrate, the second doping type being opposite to the first doping type, the first region and the retrograde well having a common junction, the retrograde well having a first layer having a lower peak doping than a deeper second layer;
a drain region disposed in or above the retrograde well;
a channel region disposed between the source region and the drain region in the first region;
a gate disposed above the substrate between the source region and the drain region;
an extended drain region disposed in the retrograde well, the extended drain region coupling the channel region with the drain region, the extended drain region comprising a gate overlap region;
an isolation region disposed between the gate overlap region and the drain region, wherein a depth of the first layer is greater than a depth of the isolation region; and
a drain spacer layer having the first doping type disposed laterally adjacent the drain region between the isolation region and the drain region.

20. The transistor of claim 19, wherein the first region comprises a well region.

21. The transistor of claim 19, wherein a depth of the isolation region is greater than a depth of the drain region, and wherein a length of the drain region is greater than a depth of the isolation region.

22. The transistor of claim 19, further comprising a silicide region disposed over the drain region, wherein a surface area of the silicide region is about the same as a surface area of the drain region.

23. The transistor of claim 19, further comprising:

a silicide region disposed over the drain region, wherein the silicide region is spaced away from the drain spacer layer, wherein the drain spacer layer contacts a sidewall of the isolation region.

24. The transistor of claim 19, wherein the transistor is a n-channel drain extended metal oxide semiconductor (DeMOS) transistor, wherein the source region and the drain region comprise heavily doped n$^+$ regions, wherein the channel region is a p-type region, and wherein the retrograde well is an n-type region.

25. The transistor of claim 19, wherein the transistor is a p-channel drain extended metal oxide semiconductor (DeMOS) transistor, wherein the source region and the drain region comprise heavily doped p$^+$ regions, wherein the channel region is a n-type region, and wherein the retrograde well is an p-type region.

26. The transistor of claim 19, wherein the channel region comprises a hetero epitaxial semiconductor material different from the material of the substrate.

27. A semiconductor device comprising:

a first region having a first doping type disposed in a substrate;

a deep well region having a second doping type disposed in a substrate, wherein the first region is disposed within the deep well region;

a channel region having the first doping type disposed in the first region;

a retrograde well having the second doping type disposed in the substrate, the second doping type being opposite to the first doping type;

a drain region having the second doping type disposed in the substrate over the retrograde well;

an extended drain region disposed in the retrograde well coupling the channel region with the drain region, the extended drain region comprising a gate overlap region; and an isolation region disposed between the gate overlap region of the extended drain region and the drain region, wherein the isolation region is disposed in the retrograde well, and wherein a length of the drain region is greater than a depth of the isolation region; and a drain spacer layer disposed laterally adjacent the drain region between the isolation region and the drain region.

28. The device of claim 27, wherein the isolation region extends deeper into the substrate than the drain region, and wherein a depth of the isolation region is greater than a lateral width of the isolation region.

29. The device of claim 28, wherein the retrograde well comprises a shallower layer of a first peak doping and a deeper layer of a second peak doping higher than the first peak doping, wherein the shallower layer extends deeper into the substrate than the isolation region.

30. The device of claim 27, wherein an exposed top surface of the drain spacer layer is covered by an insulating material so that the drain spacer layer is separated from a metallic material by an insulating material region or a semiconductor region.

31. The device of claim 30, further comprising a silicide region disposed over the drain region, wherein the silicide region is spaced away from the drain spacer layer.

32. The device of claim 30, wherein the drain spacer layer comprises a doping opposite to the doping of the drain region.

33. The device of claim 30, wherein the drain spacer layer comprises a same type of doping as the doping of the drain region, and wherein the drain spacer layer has a lower doping than the drain region.

* * * * *

UNITED STATES PATENT AND TRADEMARK OFFICE
CERTIFICATE OF CORRECTION

PATENT NO. : 8,536,648 B2  
APPLICATION NO. : 13/020368  
DATED : September 17, 2013  
INVENTOR(S) : Mayank Shrivastava Page 1 of 1

It is certified that error appears in the above-identified patent and that said Letters Patent is hereby corrected as shown below:

In the Claims:

In Col. 14, line 58, claim 9, delete "n$^+$regions" and insert --n$^+$ regions--.

In Col. 14, line 63, claim 10, delete "p$^+$regions" and insert --p$^+$ regions--.

In Col. 16, line 3, claim 17, delete "then" and insert --than--.

In Col. 16, line 9, claim 17, delete "3×10 $^{17}$ cm$^{-3\ \text{to about}}$" and insert --3×10$^{17}$ cm$^{-3}$ to about--.

In Col. 16, line 10, claim 17, delete "5×10$^{17 \text{cm-3, and the second peak doping is about}}$" and insert --5×10$^{17}$ cm$^{-3}$, and the second peak doping is about--.

In Col. 16, line 10, claim 17, delete "2×10$^{18\ \text{cm-3}}$" and insert --2×10$^{18}$ cm$^{-3}$--.

In Col. 16, line 11, claim 17, delete "3×10$^{18\ \text{cm-3}}$" and insert --3×10$^{18}$ cm$^{-3}$--.

In Col. 16, line 38, claim 18, delete "$^{\text{cm-3 to about}}$" and insert --cm$^{-3}$ to about--.

In Col. 16, line 39, claim 18, delete "$^{\text{cm-3}}$" and insert --cm$^{-3}$--.

In Col. 16, line 40, claim 18, delete "$^{\text{cm-3}}$" and insert --cm$^{-3}$--.

In Col. 17, line 16, claim 24, delete "n$^+$regions" and insert --n$^+$ regions--.

In Col. 17, line 22, claim 25, delete "p$^+$regions" and insert --p$^+$ regions--.

Signed and Sealed this  
Tenth Day of December, 2013

Margaret A. Focarino  
*Commissioner for Patents of the United States Patent and Trademark Office*